United States Patent
Miyairi et al.

(10) Patent No.: US 10,205,030 B2
(45) Date of Patent: Feb. 12, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Hidekazu Miyairi, Isehara (JP); Kengo Akimoto, Atsugi (JP); Yasuo Nakamura, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/723,479

(22) Filed: Oct. 3, 2017

(65) Prior Publication Data
US 2018/0040741 A1   Feb. 8, 2018

Related U.S. Application Data

(63) Continuation of application No. 15/254,529, filed on Sep. 1, 2016, now Pat. No. 9,793,416, which is a
(Continued)

(30) Foreign Application Priority Data

Aug. 8, 2008 (JP) ................... 2008-206006

(51) Int. Cl.
*H01L 29/786* (2006.01)
*H01L 27/12* (2006.01)
(Continued)

(52) U.S. Cl.
CPC .. *H01L 29/78696* (2013.01); *H01L 21/02323* (2013.01); *H01L 21/02565* (2013.01);
(Continued)

(58) Field of Classification Search
CPC ................................. H01L 21/02296
See application file for complete search history.

(56) References Cited

U.S. PATENT DOCUMENTS 5,473,168 A   12/1995 Kawai et al.
5,731,856 A   3/1998 Kim et al.
(Continued)

FOREIGN PATENT DOCUMENTS

EP   0622855 A   11/1994
EP   1396881 A   3/2004
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Cheung Lee
(74) *Attorney, Agent, or Firm* — Robinson Intellectual Property Law Office; Eric J. Robinson

(57) ABSTRACT

To provide a method by which a semiconductor device including a thin film transistor with excellent electric characteristics and high reliability is manufactured with a small number of steps. After a channel protective layer is formed over an oxide semiconductor film containing In, Ga, and Zn, a film having n-type conductivity and a conductive film are formed, and a resist mask is formed over the conductive film. The conductive film, the film having n-type conductivity, and the oxide semiconductor film containing In, Ga, and Zn are etched using the channel protective layer and gate insulating films as etching stoppers with the resist mask, so that source and drain electrode layers, a buffer layer, and a semiconductor layer are formed.

42 Claims, 25 Drawing Sheets

Related U.S. Application Data continuation of application No. 14/945,937, filed on Nov. 19, 2015, now Pat. No. 9,437,748, which is a continuation of application No. 14/712,254, filed on May 14, 2015, now Pat. No. 9,236,456, which is a continuation of application No. 14/529,529, filed on Oct. 31, 2014, now Pat. No. 9,166,058, which is a continuation of application No. 14/260,598, filed on Apr. 24, 2014, now Pat. No. 8,946,703, which is a continuation of application No. 13/727,056, filed on Dec. 26, 2012, now Pat. No. 8,729,547, which is a continuation of application No. 12/535,713, filed on Aug. 5, 2009, now Pat. No. 8,343,817.

(51) Int. Cl.

| | | |
|---|---|---|
| H01L 29/26 | (2006.01) | |
| H01L 29/66 | (2006.01) | |
| H01L 21/02 | (2006.01) | |
| H01L 21/465 | (2006.01) | |
| H01L 21/467 | (2006.01) | |
| H01L 21/4763 | (2006.01) | |
| H01L 21/3213 | (2006.01) | |
| H01L 29/06 | (2006.01) | |
| H01L 29/10 | (2006.01) | |
| H01L 29/24 | (2006.01) | |
| H01L 29/423 | (2006.01) | |
| H01L 29/49 | (2006.01) | |
| H01L 29/51 | (2006.01) | |

(52) U.S. Cl.
CPC ...... *H01L 21/32139* (2013.01); *H01L 21/465* (2013.01); *H01L 21/467* (2013.01); *H01L 21/4763* (2013.01); *H01L 21/47635* (2013.01); *H01L 27/1225* (2013.01); *H01L 29/0692* (2013.01); *H01L 29/1033* (2013.01); *H01L 29/24* (2013.01); *H01L 29/263* (2013.01); *H01L 29/42364* (2013.01); *H01L 29/42384* (2013.01); *H01L 29/495* (2013.01); *H01L 29/4908* (2013.01); *H01L 29/513* (2013.01); *H01L 29/518* (2013.01); *H01L 29/66742* (2013.01); *H01L 29/66969* (2013.01); *H01L 29/7869* (2013.01); *H01L 29/78606* (2013.01); *H01L 29/78618* (2013.01); *H01L 29/78633* (2013.01); *H01L 29/78693* (2013.01)

(56) References Cited

U.S. PATENT DOCUMENTS

| | | |
|---|---|---|
| 5,744,864 A | 4/1998 | Cillessen et al. |
| 6,255,668 B1 | 7/2001 | Kang et al. |
| 6,294,274 B1 | 9/2001 | Kawazoe et al. |
| 6,297,519 B1 | 10/2001 | Fujikawa et al. |
| 6,455,357 B2 | 9/2002 | Kang et al. |
| 6,509,215 B2 | 1/2003 | Fujikawa et al. |
| 6,563,174 B2 | 5/2003 | Kawasaki et al. |
| 6,576,534 B1 | 6/2003 | Zhang et al. |
| 6,727,522 B1 | 4/2004 | Kawasaki et al. |
| 6,794,682 B2 | 9/2004 | Watanabe et al. |
| 6,897,479 B2 | 5/2005 | Fujikawa et al. |
| 6,900,461 B2 | 5/2005 | Inoue et al. |
| 7,034,335 B2 | 4/2006 | Fujikawa et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| RE39,452 E | 1/2007 | Fujikawa et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,566,904 B2 | 7/2009 | Ishii |
| 7,585,698 B2 | 9/2009 | Ishii |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,859,606 B2 | 12/2010 | Higaki et al. |
| 7,884,360 B2 | 2/2011 | Takechi et al. |
| 7,893,431 B2 | 2/2011 | Kim et al. |
| 7,919,365 B2 | 4/2011 | Kim et al. |
| 7,923,723 B2 | 4/2011 | Hayashi et al. |
| 8,003,981 B2 | 8/2011 | Iwasaki et al. |
| 8,063,421 B2 | 11/2011 | Kang et al. |
| 8,129,717 B2 | 3/2012 | Yamazaki et al. |
| 8,134,156 B2 | 3/2012 | Akimoto |
| 8,143,115 B2 | 3/2012 | Omura et al. |
| 8,148,721 B2 | 4/2012 | Hayashi et al. |
| 8,158,464 B2 | 4/2012 | Akimoto |
| 8,368,079 B2 | 2/2013 | Akimoto |
| 8,420,442 B2 | 4/2013 | Takechi et al. |
| 8,421,070 B2 | 4/2013 | Kim et al. |
| 8,514,341 B2 | 8/2013 | Higaki et al. |
| 8,525,165 B2 | 9/2013 | Akimoto |
| 8,698,215 B2 | 4/2014 | Jeong et al. |
| 8,735,882 B2 | 5/2014 | Kim et al. |
| 8,889,480 B2 | 11/2014 | Takechi et al. |
| 9,130,049 B2 | 9/2015 | Sano et al. |
| 9,209,026 B2 | 12/2015 | Takechi et al. |
| 9,437,748 B2 | 9/2016 | Miyairi et al. |
| 9,583,637 B2 | 2/2017 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0020165 A1 | 1/2003 | Matsumoto |
| 2003/0189401 A1 | 10/2003 | Kido et al. |
| 2003/0218222 A1 | 11/2003 | Wager, III et al. |
| 2004/0007748 A1 | 1/2004 | Sakama et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0070055 A1 | 3/2005 | Kunii |
| 2005/0199959 A1 | 9/2005 | Chiang et al. |
| 2005/0221542 A1 | 10/2005 | Yamazaki et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0199317 A1 | 9/2006 | Kunii |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |

(56) References Cited

U.S. PATENT DOCUMENTS

| | | |
|---|---|---|
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0298553 A1 | 12/2007 | Kunii |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0025676 A1 | 2/2010 | Yamazaki et al. |
| 2010/0025677 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0155717 A1 | 6/2010 | Yano et al. |
| 2011/0256684 A1 | 10/2011 | Iwasaki et al. |
| 2012/0168750 A1 | 7/2012 | Hayashi et al. |
| 2013/0328050 A1 | 12/2013 | Higaki et al. |
| 2014/0145188 A1 | 5/2014 | Jeong et al. |
| 2015/0084048 A1 | 3/2015 | Hayashi et al. |
| 2017/0125605 A1 | 5/2017 | Sano et al. |

FOREIGN PATENT DOCUMENTS

| | | | |
|---|---|---|---|
| EP | 1737044 | A | 12/2006 |
| EP | 214991 | A | 2/2010 |
| EP | 2149911 | A | 2/2010 |
| EP | 2226847 | A | 9/2010 |
| EP | 2264770 | A | 12/2010 |
| EP | 2453480 | A | 5/2012 |
| EP | 2453481 | A | 5/2012 |
| EP | 2455975 | A | 5/2012 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 02-164042 | A | 6/1990 |
| JP | 05-251705 | A | 9/1993 |
| JP | 06-314789 | A | 11/1994 |
| JP | 08-264794 | A | 10/1996 |
| JP | 09-270517 | A | 10/1997 |
| JP | 11-505377 | | 5/1999 |
| JP | 2000-044236 | A | 2/2000 |
| JP | 2000-077666 | A | 3/2000 |
| JP | 2000-101091 | A | 4/2000 |
| JP | 2000-150900 | A | 5/2000 |
| JP | 2002-076356 | A | 3/2002 |
| JP | 2002-289859 | A | 10/2002 |
| JP | 2002-324904 | A | 11/2002 |
| JP | 2002-368229 | A | 12/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2005-093460 | A | 4/2005 |
| JP | 2005-108930 | A | 4/2005 |
| JP | 2005-108931 | A | 4/2005 |
| JP | 2005-285890 | A | 10/2005 |
| JP | 2006-005116 | A | 1/2006 |
| JP | 2006-100760 | A | 4/2006 |
| JP | 2006-106106 | A | 4/2006 |
| JP | 2006-113571 | A | 4/2006 |
| JP | 2006-165529 | A | 6/2006 |
| JP | 2006-165531 | A | 6/2006 |
| JP | 2006-186119 | A | 7/2006 |
| JP | 2007-073697 | A | 3/2007 |
| JP | 2007-096055 | A | 4/2007 |
| JP | 2007-109918 | A | 4/2007 |
| JP | 2007-123861 | A | 5/2007 |
| JP | 2007-150158 | A | 6/2007 |
| JP | 2007-157916 | A | 6/2007 |
| JP | 2007-165861 | A | 6/2007 |
| JP | 2007-220816 | A | 8/2007 |
| JP | 2007-250982 | A | 9/2007 |
| JP | 2007-250983 | A | 9/2007 |
| JP | 2007-281409 | A | 10/2007 |
| JP | 2007-284342 | A | 11/2007 |
| JP | 2007-298627 | A | 11/2007 |
| JP | 2007-311404 | A | 11/2007 |
| JP | 2008-042088 | A | 2/2008 |
| JP | 2008-060419 | A | 3/2008 |
| JP | 2008-219008 | A | 9/2008 |
| JP | 2008-243928 | A | 10/2008 |
| KR | 2000-0000907 | A | 1/2000 |
| KR | 2007-0107058 | A | 11/2007 |
| KR | 10-0787455 | | 12/2007 |
| KR | 10-0787464 | | 12/2007 |
| KR | 2008-0052107 | A | 6/2008 |
| WO | WO-2004/114391 | | 12/2004 |
| WO | WO-2006/025609 | | 3/2006 |
| WO | WO-2006/030937 | | 3/2006 |
| WO | WO-2006/051993 | | 5/2006 |
| WO | WO-2006/132439 | | 12/2006 |
| WO | WO-2007/032294 | | 3/2007 |
| WO | WO-2007/058329 | | 5/2007 |
| WO | WO-2007/108293 | | 9/2007 |
| WO | WO-2007/119386 | | 10/2007 |
| WO | WO-2007/120010 | | 10/2007 |
| WO | WO-2008/069056 | | 6/2008 |
| WO | WO-2008/069255 | | 6/2008 |

OTHER PUBLICATIONS

Dembo.H et al., "RFCPUS on Glass and Plastic Substrates Fabricated by TFT Transfer Technology", iEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Dispay on Plastic Film and Its Bending Properties", SID Digest '09 : SID International Symposium Digest of Technical Papers, May 31, 2009, pp. 983-985.
Sakata.J et al., "Development of 4.0-In, AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID Internaional Symosium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu,Or Zn]at Temperatures over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Parks.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1818.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Office Action (U.S. Appl. No. 13/013,054) dated Jul. 19, 2012.
Office Action (U.S. Appl. No. 13/013,054) dated Jan. 10, 2013.
Office Action (U.S. Appl. No. 13/013,054) dated Jun. 10, 2013.
Pending Claims (U.S. Appl. No. 13/013,054) filed on May 10, 2013.
Taiwanese Office Action (Application No. 102124904) dated Mar. 2, 2015.
Taiwanese Office Action (Application No. 103139362) dated Mar. 25, 2016.
Korean Office Action (Application No. 2009-0072669) dated Mar. 21, 2016.
Korean Office Action (Application No. 2017-0161185) dated Feb. 27, 2018.
Korean Office Action (Application No. 2017-0161185) dated Sep. 7, 2018.

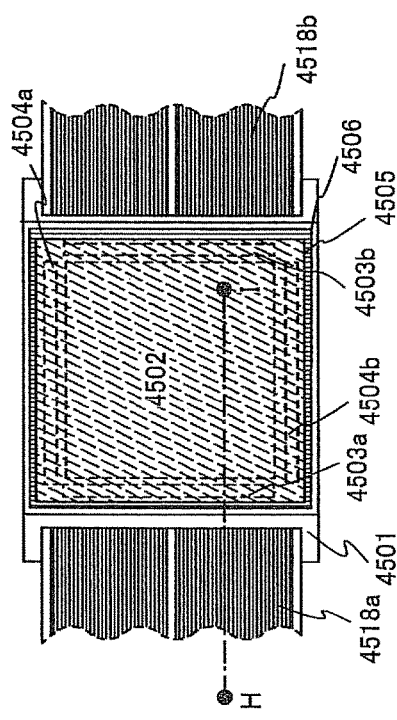
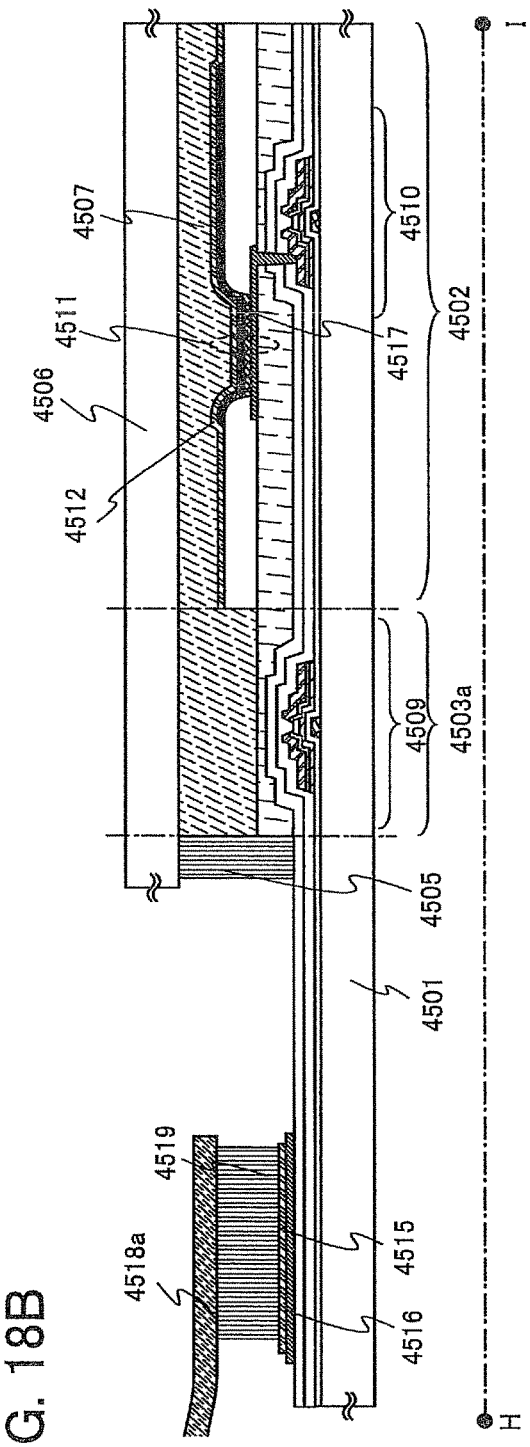
FIG. 18A
FIG. 18B

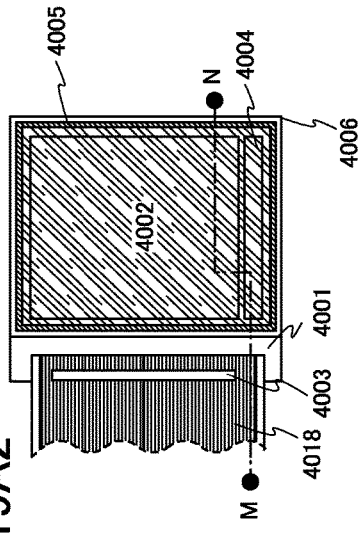
FIG. 19A1
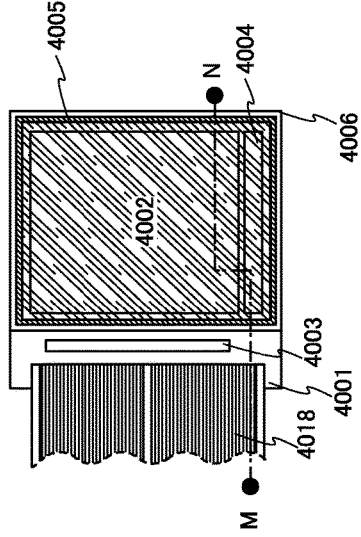
FIG. 19A2
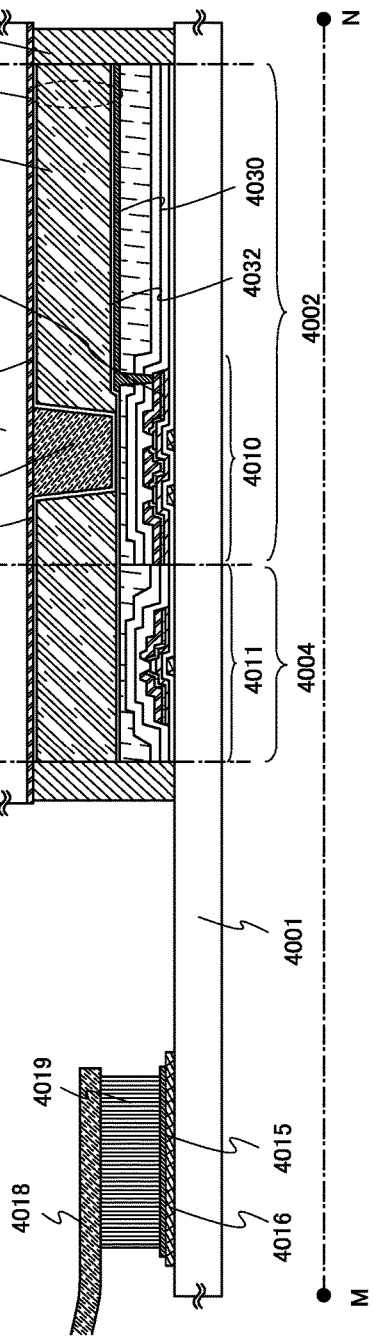
FIG. 19B

METHOD FOR MANUFACTURING SEMICONDUCTOR DEVICE

BACKGROUND OF THE INVENTION

1. Field of the Invention

The present invention relates to a semiconductor device having a circuit including a thin film transistor (hereinafter referred to as a TFT) using an oxide semiconductor film for a channel formation region and a method for manufacturing the semiconductor device. For example, the present invention relates to an electronic appliance mounted with an electro-optic device typified by a liquid crystal display panel or a light-emitting display device having an organic light-emitting element as a component.

Note that the semiconductor devices in this specification refer to all the devices which can operate by using semiconductor characteristics, and an electro-optic device, a semiconductor circuit, and an electronic appliance are all included in the semiconductor devices.

2. Description of the Related Art

In recent years, active matrix display devices (such as liquid crystal display devices, light-emitting display devices, and electrophoretic display devices) in each of which a switching element including a thin film transistor (TFT) is provided in each of display pixels arranged in matrix have been actively developed. An active matrix display device is advantageous because a switching element is provided in each pixel (or each dot) and thus lower voltage driving is possible as compared to a passive matrix display device in the case where pixel density is increased.

In addition, a technique applied to an electronic device or an optical device, in which a thin film transistor (TFT) or the like is formed using an oxide semiconductor film for a channel formation region, has attracted attention. As an oxide semiconductor film, a TFT using ZnO and a TFT using $InGaO_3(ZnO)_m$ are given for example. Patent Documents 1 and 2 and the like disclose a technique applied to a switching element or the like of an image display device, in which a TFT formed using such an oxide semiconductor film is formed over a substrate having a light-transmitting property.

CITATION LIST

[Patent Document 1] Japanese Published Patent Application No. 2007-123861.

[Patent Document 2] Japanese Published Patent Application No. 2007-96055.

SUMMARY OF THE INVENTION

A thin film transistor using an oxide semiconductor film for a channel formation region is required to operate rapidly, be manufactured through a relatively simple process, and be sufficiently reliable.

In forming a thin film transistor, a metal material having low resistance is used for source and drain electrode layers. In particular, in the case of manufacturing display devices performing large-area display, the problem of signal delay due to wiring resistance becomes significant. Therefore, a metal material having low electric resistance is desirably used as a material of a wiring or an electrode. In the case of the thin film transistor structure in which an oxide semiconductor film is directly in contact with source and drain electrode layers formed using a metal material having low electric resistance, contact resistance might be high. As one of factors causing high contact resistance, the following condition is given: Schottky junction is formed at the interface between the oxide semiconductor film and the source and drain electrode layers.

In addition, capacitance is caused in a portion where the oxide semiconductor film and the source and drain electrode layers are directly in contact with each other, and frequency characteristics (referred to as f characteristics) are low, which might hinder rapid operation of the thin film transistor.

Further, the oxide semiconductor film is susceptible to damage such as reduction in film thickness by an etchant or change in an amount of oxygen vacancy by plasma. If the damaged semiconductor layer is used for a thin film transistor, characteristics vary. Thus, in the case where an inverted staggered thin film transistor using an oxide semiconductor film is manufactured, a structure in which a channel protective layer protecting a channel formation region from damage is effective. However, in accordance with formation of the channel protective layer, the number of photomasks that are used is increased, a process becomes complicated, and productivity may be decreased.

It is an object of the present invention to provide a method for manufacturing a thin film transistor in which contact resistance between an oxide semiconductor layer containing indium (In), gallium (Ga), and zinc (Zn) and source and drain electrode layers is small and in which the oxide semiconductor layer is less damaged in a manufacturing process of the thin film transistor, with a small number of steps.

The summary of the present invention is that a method for manufacturing an inverted-staggered (bottom-gate) thin film transistor is included in which an oxide semiconductor layer containing In, Ga, and Zn is used, a buffer layer is provided between the semiconductor layer and source and drain electrode layers, and a channel protective layer is provided.

In this specification, a semiconductor layer formed using an oxide semiconductor film containing In, Ga, and Zn is also referred to as an "IGZO semiconductor layer".

An ohmic contact of a source electrode and an IGZO semiconductor layer is necessary and the contact resistance therebetween is desirably as low as possible. Similarly, an ohmic contact of a drain electrode and the IGZO semiconductor layer is necessary and the contact resistance therebetween is desirably as low as possible.

Therefore, an ohmic contact is formed by intentionally providing a buffer layer having a higher carrier concentration than the IGZO semiconductor layer between the source electrode and the IGZO semiconductor layer.

Further, since a structure of a thin film transistor to which an embodiment of the present invention is applied is provided with a channel protective layer, not only a channel formation region but also a region opposite to a surface which is in contact with a gate insulating film of an IGZO semiconductor layer, i.e., a back channel can be protected from damage in a process (such as reduction in film thickness by plasma or an etchant in etching or oxidation), whereby reliability of a semiconductor device can be improved.

An embodiment of the present invention is a method for manufacturing a semiconductor device including the steps of: forming a gate electrode layer over a substrate; forming a gate insulating film over the gate electrode layer; forming an oxide semiconductor film containing indium, gallium, and zinc over the gate insulating film; forming a channel protective layer in a region overlapping with a channel formation region over the semiconductor film; forming a film having n-type conductivity over the semiconductor film; forming a conductive film over the film having n-type conductivity; forming a resist mask over the conductive film; and etching the conductive film, the film having n-type conductivity, and the semiconductor film using the resist mask to form source and drain electrode layers, a buffer layer, and a semiconductor layer.

An embodiment of the present invention is a method for manufacturing a semiconductor device including the steps of: forming a gate electrode layer having a light-shielding property over a substrate having a light-transmitting property; forming a gate insulating film having a light-transmitting property over the gate electrode layer; forming an oxide semiconductor film containing indium, gallium, and zinc over the gate insulating film; forming an insulating film having a light-transmitting property over the semiconductor film; forming a photoresist film over the insulating film; exposing the photoresist film to light from the substrate side using the gate electrode layer as a photomask to form a resist mask; and forming a channel protective layer using the resist mask.

An embodiment of the present invention is a method for manufacturing a semiconductor device in which a gate insulating film and a channel protective layer serve as etching stoppers.

According to the present invention, a thin film transistor having a small photocurrent, low parasitic capacitance, a high on-off ratio, and favorable dynamic characteristics (f characteristics) can be manufactured with a small number of steps. Accordingly, a semiconductor device including the thin film transistor having excellent electric characteristics and high reliability can be provided by a method with excellent productivity.

BRIEF DESCRIPTION OF THE DRAWINGS

FIGS. 18A and 18B are diagrams illustrating a light-emitting display device to which an embodiment of the present invention is applied.

FIGS. 19A1, 19A2, and 19B are diagrams each illustrating a liquid crystal display device to which an embodiment of the present invention is applied.

DETAILED DESCRIPTION OF THE INVENTION

Figure 1A:
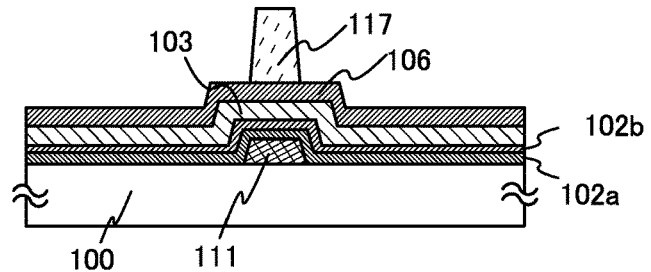
FIGS. 1A to 1D are diagrams illustrating a semiconductor device to which an embodiment of the present invention is applied.

The embodiments of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiments. Note that a common reference numeral refers to the same part or a part having a similar function throughout the drawings in the structure of the present invention described below, and the description thereof is omitted.

Embodiment 1

In this embodiment, a manufacturing process of an inverted staggered (bottom gate) thin film transistor in which an oxide semiconductor layer containing In, Ga, and Zn is used, a buffer layer is provided between the semiconductor layer and source and drain electrode layers, and a channel protective layer is provided is described with reference to FIGS. 1A to 1D and FIGS. 2A and 2B.

Figure 1B:
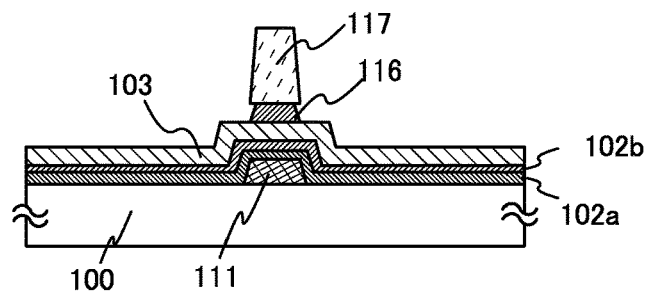

FIGS. 1A to 1D show a manufacturing process of a bottom gate thin film transistor of this embodiment. FIG. 2A is a plane view of a thin film transistor manufactured through steps of FIGS. 1A to 1D, and FIG. 2B is a cross-sectional view taken along a line A1-A2 in FIG. 2A.

As a substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film over its surface, may also be used. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

Further, an insulating film may be provided as a base film over the substrate 100. The base film can be formed to have a single-layer structure or a layered structure of a silicon oxide film, a silicon nitride film, a silicon oxynitride film, and/or a silicon nitride oxide film by a CVD method, a sputtering method, or the like.

A gate electrode layer 111 is formed using a metal material. As the metal material, aluminum, chromium, titanium, tantalum, molybdenum, copper, or the like is applied. A preferred example of the gate electrode is formed using aluminum or a stack of aluminum and barrier metal. As the barrier metal, refractory metal such as titanium, molybdenum, or chromium is applied. The barrier metal is preferably provided for preventing hillocks and oxidation of aluminum.

A conductive film which is to be the gate electrode layer 111 is formed to a thickness of from 50 to 300 nm. By forming the gate electrode to a thickness of 300 nm or less, disconnection of a semiconductor film and wirings which are formed later can be prevented. Further, by forming the gate electrode to a thickness of 150 nm or more, resistance of the gate electrode can be reduced and thus the size of the substrate can be increased.

Note that since a semiconductor film and a wiring are to be formed over the gate electrode layer 111, it is desired that the gate electrode layer 111 be processed to have tapered end portions in order to prevent disconnection. In addition, although not illustrated, in this step, a wiring or a capacitor wiring connected to the gate electrode can also be formed at the same time.

The gate electrode layer 111 can be formed by a sputtering method, a CVD method, a plating method, or a printing method. Alternatively, the gate electrode layer 111 can be formed using a conductive nanopaste of silver, gold, copper, or the like by discharging droplets containing conductive particles or the like by an ink-jet method and baking it.

Note that here, an aluminum film and a molybdenum film are formed as a conductive film over the substrate by a sputtering method and is etched with the use of a resist mask formed using a first photomask of this embodiment, so that the gate electrode layer 111 is formed.

Gate insulating films 102a and 102b can each be formed using a silicon oxide film, a silicon nitride film, a silicon oxynitride film, or a silicon nitride oxide film with a thickness of from 50 to 150 nm. Note that the gate insulating film can be formed to have a single layer structure of a silicon oxide film, a silicon nitride film, a silicon oxynitride film, or a silicon nitride oxide film, instead of such a two-layer structure. Alternatively, the gate insulating film may be formed to have a three-layer structure.

By forming the gate insulating film 102a using a silicon nitride film or a silicon nitride oxide film, adhesiveness between the substrate and the gate insulating film 102a is increased, and in the case where a glass substrate is used as the substrate, an impurity can be prevented from diffusing into a semiconductor layer 103 from the substrate and further, the gate electrode layer 111 can be prevented from being oxidized. That is to say, film peeling can be prevented, and thus electric characteristics of a thin film transistor to be completed later can be improved. Further, the gate insulating films 102a and 102b each preferably have a thickness of 50 nm or more so that they can cover unevenness of the gate electrode layer 111.

Here, a silicon oxynitride film refers to a film that contains oxygen and nitrogen such that the amount of oxygen is larger than that of nitrogen and contains oxygen, nitrogen, silicon, and hydrogen at concentrations of 55 to 65 at. %, 1 to 20 at. %, 25 to 35 at. %, and 0.1 to 10 at. %, respectively. Further, a silicon nitride oxide film refers to a film that contains oxygen and nitrogen such that the amount of nitrogen is larger than that of oxygen and includes oxygen, nitrogen, silicon, and hydrogen at concentrations of 15 to 30 at. %, 20 to 35 at. %, 25 to 35 at. %, and 15 to 25 at. %, respectively.

Further, for the gate insulating film 102b in contact with the semiconductor layer 103, silicon oxide, aluminum oxide, magnesium oxide, aluminum nitride, yttrium oxide, hafnium oxide, or the like can be used.

The gate insulating films 102a and 102b can each be formed by a CVD method, a sputtering method, or the like. Here, as illustrated in FIG. 1A, a silicon nitride film is formed by a plasma CVD method as the gate insulating film 102a, and a silicon oxide film is formed by a sputtering method as the gate insulating film 102b.

In particular, it is desirable to successively form the gate insulating film 102b in contact with a semiconductor film, and the semiconductor film 103. By the successive film formation, an interface of the stacked films can be formed without being contaminated by an atmospheric component such as water vapor and impurity elements and dusts which float in the air. Thus, variations in thin film transistor characteristics can be reduced.

As for an active matrix display device, electric characteristics of a thin film transistor included in a circuit are significant and performance of the display device depends on the electric characteristics. The threshold voltage ($V_{th}$) is particularly significant among the electric characteristics of the thin film transistor. Even when field effect mobility is high, if the value of the threshold voltage is high or below zero, it is difficult to control a circuit. A thin film transistor in which the value of the threshold voltage is high and the absolute value of the threshold voltage is large might not be able to achieve a switching function and might be a load in the state where the driving voltage is low. Further, in the case where the value of the threshold voltage is below zero, a thin film transistor is likely to be in a so-called normally-on state in which a current flows between a source electrode and a drain electrode even when a gate voltage is 0 V.

In the case of an n-channel thin film transistor, it is desirable that only after a positive voltage is applied as a gate voltage, a channel be formed and a drain current flows. A transistor in which a channel is not formed unless the driving voltage is high and a transistor in which even when a negative voltage is applied, a channel is formed and then a drain current flows are not suitable as a thin film transistor used for a circuit. Therefore, in the case of a thin film transistor using an oxide semiconductor film containing In, Ga, and Zn, a channel is desirably formed at a threshold voltage of the gate voltage which is a positive and close to 0 V.

A threshold voltage of a thin film transistor is considered to significantly depend on the interface of an oxide semiconductor layer, that is, the interface between an oxide semiconductor layer and a gate insulating film. By forming the interface thereof so that it is clean, electric characteristics of a thin film transistor can be improved and a manufacturing process can be prevented from being complicated. Thus, both mass productivity and high performance of the thin film transistor can be achieved.

In particular, when moisture is at the interface between an oxide semiconductor layer and a gate insulating film, there occurs a problem such as degradation of electric characteristics of a thin film transistor, variations in threshold voltages, or normally-on. By successively forming the oxide semiconductor layer and the gate insulating film, such a hydrogen compound can be removed.

Thus, the gate insulating film and the semiconductor film are successively formed under reduced pressure by a sputtering method without being exposed to the air, so that a thin film transistor having a favorable interface, a small leakage current, and high current driving capability can be achieved.

Note that successive film formation in this specification means that a series of steps from a first film formation step by a sputtering method to a second film formation step by a sputtering method are performed by controlling an atmosphere in which a process substrate is provided so that it is constantly in vacuum or an inert gas atmosphere (a nitrogen atmosphere or a rare gas atmosphere) without being exposed to a contaminated atmosphere such as the air. By the successive film formation, film formation can be performed without reattachment of moisture or the like to the process substrate, which has been cleaned.

Performing the series of steps from the first film formation step to the second film formation step in the same chamber is in the range of the successive film formation in this specification.

Further, performing the series of steps from the first film formation step to the second film formation step in different chambers, in which after the first film formation step is completed, a substrate is transferred between the chambers without being exposed to the air and the second film formation is performed, is also in the range of the successive film formation in this specification.

Note that the case where there is a substrate transfer step, an alignment step, a slow cooling step, a step of heating or cooling a substrate so that the temperature of the substrate is suitable to the second film formation step, or the like between the first film formation step and the second film formation step is also in the range of the successive film formation in this specification.

However, the case where there is a step in which liquid is used, such as a cleaning step, wet etching, or resist formation, between the first film formation step and the second film formation step is not in the range of the successive film formation in this specification.

Further, by forming the gate insulating film, the semiconductor layer, and the channel protective layer in an oxygen atmosphere (or an atmosphere containing oxygen at 90% or more and a rare gas (such as argon) at 10% or less), reduction in reliability due to deterioration, a shift of thin film transistor characteristics to the normally-on side, and the like can be suppressed. Further, the buffer layer having n-type conductivity is preferably formed in a rare gas (such as argon) atmosphere.

By thus successively forming the films by a sputtering method, productivity and reliability of an interface of the thin films can be increased. Further, by forming the gate insulating film and the semiconductor layer in an oxygen atmosphere so that they contain a large mount of oxygen, reduction in reliability due to deterioration and normally-on of a thin film transistor can be suppressed.

Further, it is also desirable to form an insulating film 106 to be a channel protective layer 116, following the formation of the semiconductor film 103. By the successive film formation, an interface of the stacked films can be formed in a region on a side reverse of the side of a surface of the semiconductor film 103 in contact with a gate insulating film, a so-called back channel, without being contaminated by an atmospheric component such as water vapor and impurity elements and dusts which float in the air. Thus, variations in thin film transistor characteristics can be reduced.

For a method for successive film formation, a multi-chamber sputtering apparatus equipped with a plurality of film formation chambers, a sputtering apparatus provided with a plurality of targets, or a PLD (pulsed laser deposition) apparatus may be used.

In the case of depositing silicon oxide for the insulating film, the insulating film can be formed by a high frequency sputtering method or a reactive sputtering method using silicon oxide (artificial quartz) or silicon as a target.

Note that here, the semiconductor film 103 and the insulating film 106 to be the channel protective layer are successively formed without being exposed to the air after formation of a silicon oxide film as the second gate insulating film 102b in contact with the semiconductor film by using a multi-chamber sputtering apparatus provided with a silicon target and a target for the semiconductor film.

The semiconductor layer 103 is formed using an amorphous oxide semiconductor film. For the amorphous oxide semiconductor film, a composite oxide of an element such as indium, gallium, aluminum, zinc, or tin can be used.

In the case of oxide containing indium oxide, gallium oxide, and zinc oxide, the composition ratio of the metal elements is highly flexibly set and the oxide functions as a semiconductor layer at a wide range of mixture ratio. For example, a material in which indium oxide, gallium oxide, and zinc oxide are mixed in an equimolar ratio, and oxide containing In, Ga, and Zn at a ratio of 2.2:2.2:1.0 can be given.

The semiconductor film 103 is preferably formed to a thickness of from 2 nm to 200 nm, more preferably from 20 to 150 nm. Further, when the oxygen vacancy rate in the film is increased, a carrier concentration is increased and thus thin film transistor characteristics are degraded. Therefore, an IGZO film containing excessive oxygen is formed by performing sputtering by a pulsed DC sputtering method under, for example, an atmosphere containing only oxygen or atmosphere containing oxygen at 90% and Ar at 10%.

The amorphous oxide semiconductor film can be formed by a reactive sputtering method, a pulsed laser deposition method (PLD method), or a sol-gel method. Among gas phase methods, a PLD method is suitable in terms of easiness in controlling the composition of materials and a sputtering method is suitable in terms of mass productivity as described above. Here, a method using oxide containing In, Ga, and Zn (IGZO) is described as an example of a method for forming the semiconductor layer.

A target with a diameter of 8 inch obtained by mixing indium oxide ($In_2O_3$), gallium oxide ($Ga_2O_3$), and zinc oxide (ZnO) in an equimolar ratio and performing sintering is used, a substrate is provided 170 mm apart from the target, and direct current (DC) sputtering is performed with an output of 500 W, so that the semiconductor layer is formed. The semiconductor layer is formed to a thickness of 50 nm under the conditions that the chamber pressure is 0.4 Pa and the gas composition ratio of Ar to $O_2$ is 10/5 sccm. It is desirable that an oxygen partial pressure in film formation be set higher than that in forming a transparent conductive film of indium tin oxide (ITO) or the like to control the oxygen concentration in a film formation atmosphere so that oxygen vacancy is suppressed. Further, it is preferable to use a pulsed direct current (DC) power supply because dusts can be reduced and the thickness distribution of the semiconductor layer can be uniform.

Further, the semiconductor film 103 may be subjected to plasma treatment. By the plasma treatment, damage of the semiconductor film 103 can be repaired. The plasma treatment is preferably performed in an atmosphere of $O_2$ or $N_2O$, or preferably an atmosphere of $N_2$, He, or Ar containing oxygen. Alternatively, the plasma treatment may be performed in the above atmosphere to which $Cl_2$ or $CF_4$ is added. Note that the plasma treatment is preferably performed with non-bias.

Note that in this embodiment, the semiconductor film 103 is formed over the gate insulating film 102b formed in the former step without exposing the gate insulating film 102b to the air by using a multi-chamber sputtering apparatus provided with a target for an oxide semiconductor film and a silicon target. In the following step, the insulating film 106 to be the channel protective layer is formed over the formed semiconductor film 103 without exposing the semiconductor film 103 to the air.

The channel protective layer 116 is formed using an insulating film in a region overlapping with a channel formation region of the semiconductor layer. The insulating film 106 to be the channel protective layer can be formed using an inorganic material (such as silicon oxide, silicon nitride, silicon oxynitride, or silicon nitride oxide). Further, a film formed using one or a plurality of kinds of photosensitive or nonphotosensitive organic materials (organic resin materials) (such as polyimide, acrylic, polyamide, polyimide amide, resist, and benzocyclobutene) or a stack of such films can be used. Further, siloxane may be used.

The insulating film 106 to be the channel protective layer can be formed by a vapor phase growth method such as a plasma CVD method or a thermal CVD method, or a sputtering method. Alternatively, an application method such as a spin coating method which is a wet process can be used. Alternatively, the insulating film 106 may be selectively formed by a droplet discharge method, a printing method (a method for forming a pattern, such as screen printing or offset printing), or the like.

Note that here, a silicon oxide film is formed as the insulating film 106 without exposing the oxide semiconductor film 103 formed in the former step to the air by using a multi-chamber sputtering apparatus provided with a silicon target and a target for the oxide semiconductor film.

Next, a resist mask 117 is formed with the use of a second photomask of this embodiment as illustrated in FIG. 1A. The insulating film 106 formed over the semiconductor film 103 is selectively etched by using the resist mask 117, so that the channel protective layer 116 is formed as illustrated in FIG. 1B.

Next, a film 104 having n-type conductivity which functions as a buffer layer is formed over the semiconductor film 103. The buffer layer functions as an $n^+$ layer, and can be called a source region and a drain region. In addition, a second buffer layer whose carrier concentration is higher than that of the semiconductor layer and lower than that of the buffer layer may be provided between the semiconductor layer and the buffer layer. The second buffer layer functions as an $n^-$ layer.

For the buffer layer, metal oxide having n-type conductivity and an oxide semiconductor film containing In, Ga, and Zn can be used.

For the metal oxide having n-type conductivity that can be used for the buffer layer, titanium oxide, molybdenum oxide, zinc oxide, indium oxide, tungsten oxide, magnesium oxide, calcium oxide, tin oxide, or the like can be used for example. The buffer layer may contain an impurity imparting n-type or p-type conductivity. As the impurity, indium, gallium, aluminum, zinc, tin, or the like can be used. In particular, the buffer layer preferably contains titanium. Since the buffer layer formed using the metal oxide has a higher carrier concentration than the IGZO semiconductor layer 113 in which the channel is formed and is superior in conductivity, the contact resistance can be reduced as compared to the case of directly attaching the source and drain electrode layers to the semiconductor layer.

Further, for the buffer layer, an oxide semiconductor film having n-type conductivity and containing In, Ga, and Zn can also be used. An impurity element imparting n-type conductivity may be included in the oxide semiconductor film containing In, Ga, and Zn. As the impurity element, for example, magnesium, aluminum, titanium, scandium, yttrium, zirconium, hafnium, boron, thallium, germanium, tin, lead, or the like can be used. In the case where magnesium, aluminum, titanium, or the like is contained in the buffer layer, there is an effect of blocking oxygen, and the like, so that the oxygen concentration of a semiconductor layer can be maintained within an optimal range by heat treatment or the like after film formation.

In addition, a second buffer layer functioning as an $n^-$ layer, whose carrier concentration is higher than that of the semiconductor layer and lower than that of the buffer layer, may be provided between the semiconductor layer and the buffer layer.

The film 104 having n-type conductivity may be formed to have a thickness of greater than or equal to 2 nm and less than or equal to 100 nm.

The film 104 having n-type conductivity can be formed by a sputtering method or a pulsed laser deposition method (PLD method).

Next, a conductive film 105 to be a source electrode layer and a drain electrode layer is formed. The conductive film 105 can be formed using the same material as the gate electrode layer 111. In particular, a layer in contact with the film 104 having n-type conductivity is preferably a titanium film. As specific examples of the conductive film, a single titanium film, a layered film including a titanium film and an aluminum film, and a three-layer film in which a titanium film, an aluminum film, and a titanium film are sequentially stacked are given.

Figure 1C:
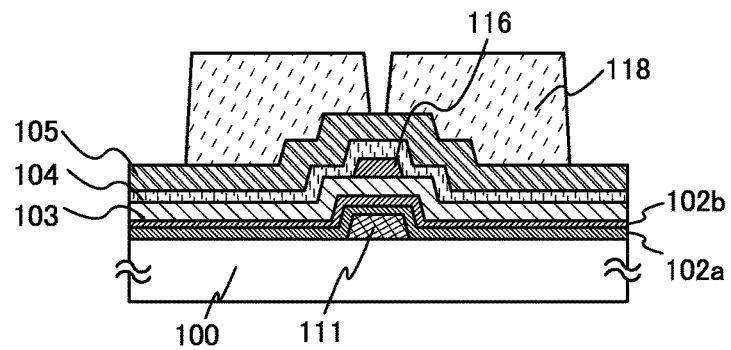
Figure 1D:
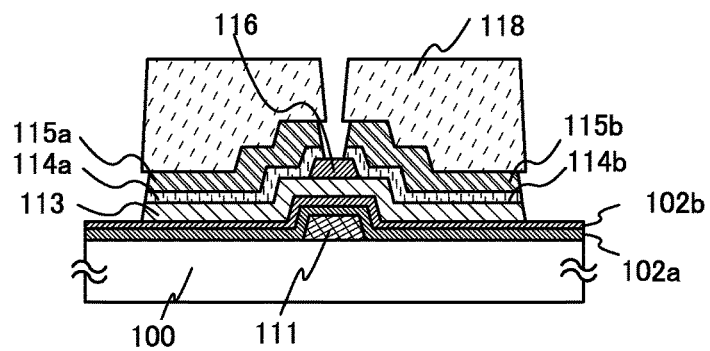
Figure 2A:
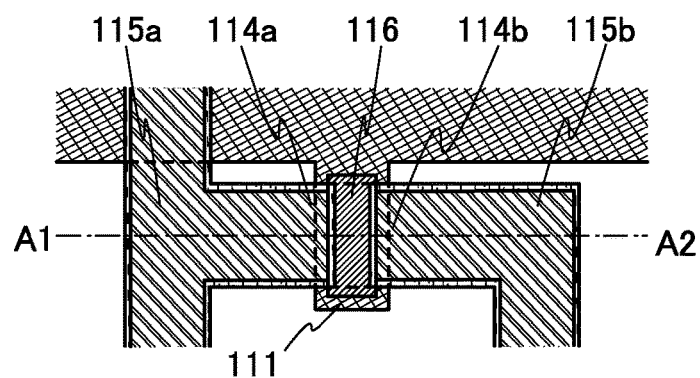
FIGS. 2A and 2B are diagrams illustrating a method for manufacturing a semiconductor device to which an embodiment of the present invention is applied.

Next, a resist mask 118 is formed using a third photomask of this embodiment as illustrated in FIG. 1C, and the conductive film 105 formed over the channel protective layer 116 is etched using the resist mask 118 to be separated as illustrated in FIG. 1D, whereby source and drain electrode layers 115a and 115b are formed.

Further, the film 104 having n-type conductivity is etched using the same resist mask 118 to be separated, whereby buffer layers 114a and 114b are formed.

Further, the channel protective layer 116 not only prevents damage to the channel formation region in the etching step but also functions as an etching stopper. That is, when an unnecessary portion of the semiconductor film 103 is removed by etching, the channel protective layer 116 prevents the channel formation region of the semiconductor layer 103 from being removed. In addition, since the gate insulating film 102b or 102a also functions as an etching stopper, the unnecessary portion of the semiconductor film 103 can be easily etched. As a result, the source and drain electrode layers (115a, 115b), the buffer layers (114a, 114b), and the semiconductor layer 113 can be formed using the resist mask 118.

Note that each film may be processed using dry etching or wet etching, or each film may be selectively etched in two separate steps.

Characteristics of the thin film transistor in which the oxide containing In, Ga, and Zn (IGZO) described in this embodiment is used for the semiconductor layer 113 are improved by performing heat treatment on the semiconductor layer 113 which is formed. Specifically, on current is increased, and variation in the characteristics of the transistor is reduced.

Heat treatment may be preferably performed on the semiconductor layer 113 at temperatures of 300° C. to 400° C., and here, the heat treatment is performed at 350° C. for an hour. The heat treatment may be performed anytime after the semiconductor layer 113 is formed. For example, the heat treatment may be performed after the gate insulating film 102b, the semiconductor film 103, and the insulating film 106 to be the channel protective layer are successively formed; after the channel protective layer 116 is formed by patterning; after the film 104 having n-type conductivity functioning as buffer layers is formed; or after the conductive film 105 is formed. Alternatively, the heat treatment may be performed after the source and drain electrode layers (115a, 115b), the buffer layers (114a, 114b), and the semiconductor layer 113 are formed or after a sealing film of the thin film transistor is formed, or heat curing treatment performed after formation of a planarizing film may also serve as the heat treatment for the semiconductor layer.

Figure 2B:
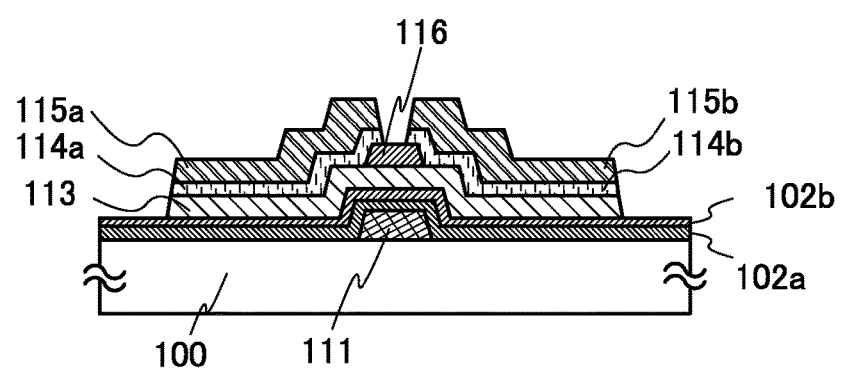

In accordance with the above description, an inverted staggered (bottom gate) thin film transistor illustrated in FIGS. 2A and 2B is manufactured.

The buffer layers 114a and 114b of the thin film transistor manufactured in this embodiment have a higher carrier concentration than the semiconductor layer 113 and thus have excellent conductivity. Therefore, in the case of providing the buffer layers 114a and 114b, contact resistance can be reduced as compared to the case where the semiconductor layer 113 and the source and drain electrode layers are directly bonded to each other. Further, by providing the buffer layers 114a and 114b at the bonding interface between the semiconductor layer 113 and the source and drain electrode layers, an electric field concentrated at the bonding interface can be reduced.

The thin film transistor manufactured in this embodiment is provided with the channel protective layer 116; therefore, a region on a side reverse of the side of a surface of the oxide semiconductor film in contact with the gate insulating film 102b, a so-called back channel, can be protected from damage (such as reduction in film thickness due to plasma or an etchant at the time of etching and oxidation) in the process. Therefore, reliability of a thin film transistor can be improved.

Further, by successively forming the gate insulating film 102b in contact with the semiconductor layer 113, the semiconductor layer 113, and the channel protective layer, interfaces of the stacked films can be formed without being contaminated by an atmospheric component such as water vapor and impurity elements and dusts which float in the air. Thus, variations in thin film transistor characteristics can be reduced.

Further, by using the channel protective layer and the gate insulating film as etching stoppers, the conductive film 105 to be source and drain electrode layers, the film 104 having n-type conductivity which is to be buffer layers, and the semiconductor film 103 can be etched using the resist mask 118 which is manufactured using the third photomask, and thus a process can be simplified.

Thus, by applying an embodiment of the present invention, a thin film transistor having a small photocurrent, low parasitic capacitance, and a high on-off ratio can be obtained and thus a thin film transistor having favorable dynamic characteristics (f characteristics) can be manufactured with high yield. Further, a semiconductor device including the thin film transistor having excellent electric characteristics and high reliability can be provided by a method with excellent productivity.

Embodiment 2

In this embodiment, a method for manufacturing an inverted staggered (bottom gate) thin film transistor having the structure in which a buffer layer contains an IGZO semiconductor layer, which is different from the structure of Embodiment 1, will be described with reference to FIGS. 3A to 3D and FIGS. 4A and 4B. In addition, in this embodiment, the same reference numerals are used for the same portions as those in Embodiment 1 and detailed description of the portions is omitted.

Figure 3A:
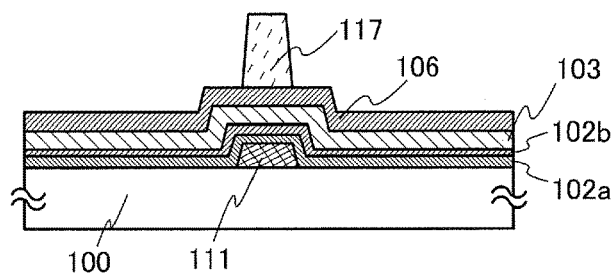
FIGS. 3A to 3D are diagrams illustrating a method for manufacturing a semiconductor device to which an embodiment of the present invention is applied.
Figure 3B:
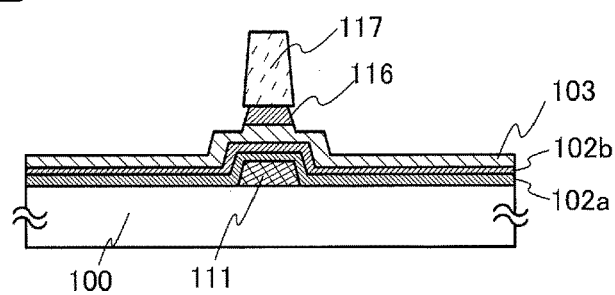
Figure 3C:
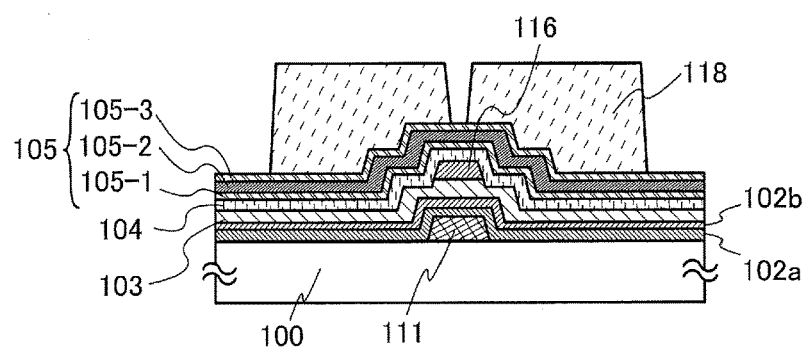
Figure 3D:
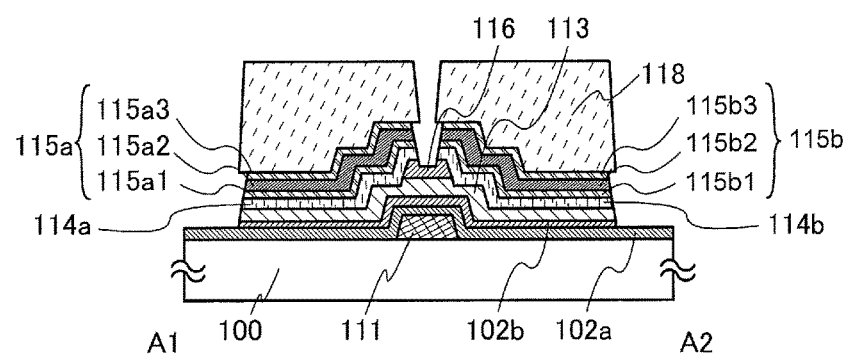
Figure 4A:
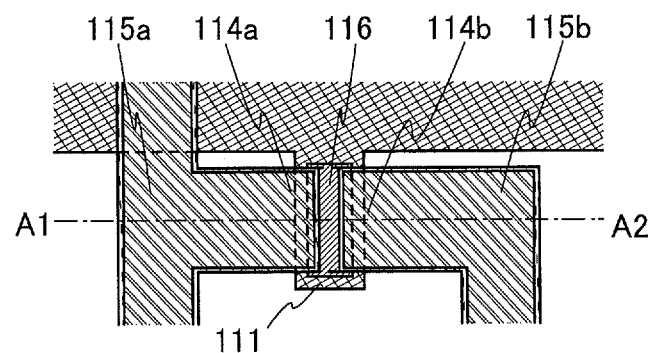
FIGS. 4A and 4B are diagrams illustrating a method for manufacturing a semiconductor device to which an embodiment of the present invention is applied.
Figure 4B:
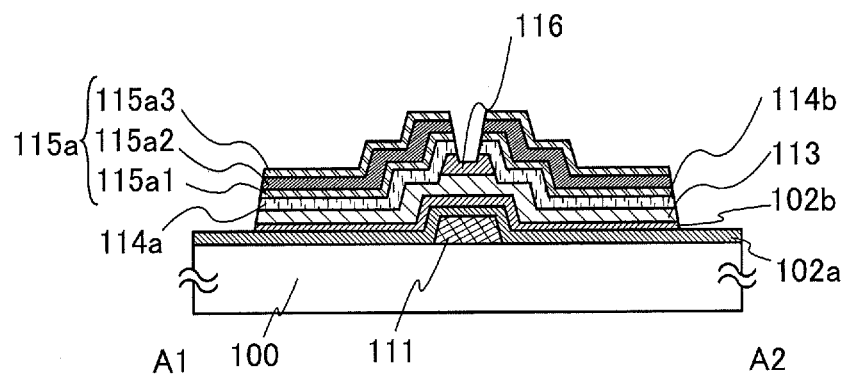

FIGS. 3A to 3D illustrate a manufacturing process of a bottom gate thin film transistor of this embodiment. FIG. 4A is a plane view of a thin film transistor manufactured through steps of FIGS. 3A to 3D, and FIG. 4B is a cross-sectional view taken along a line A1-A2 in FIG. 4A.

In this embodiment, the substrate 100 having a light-transmitting property is used. As the substrate having a light-transmitting property, for example, non-alkaline glass substrates manufactured by a fusion method or a float method, such as a barium borosilicate glass substrate, an aluminoborosilicate glass substrate, an aluminosilicate glass substrate, and the like; plastic substrates having heat resistance high enough to withstand a process temperature of this manufacturing process; and the like can be given. Note that, as in Embodiment 1, an insulating film may be formed as a base film over the substrate 100.

The gate electrode layer 111 is formed using a metal material having a light-transmitting property. As a metal material, aluminum, chromium, titanium, tantalum, molybdenum, copper, or the like is applied. A preferred example of the gate electrode is formed using aluminum or a stacked structure of aluminum and barrier metal. As the barrier metal, refractory metal such as titanium, molybdenum, or chromium is applied. The barrier metal is preferably provided for preventing hillocks and oxidation of aluminum. The thickness, the shape of end portions, a film formation method, or the like of the gate electrode layer 111 having a light-shielding property is set as in Embodiment 1.

Note that here, an aluminum film and a molybdenum film are formed as a conductive film over the substrate by a sputtering method and is etched with the use of a resist mask formed using a first photomask of this embodiment, so that the gate electrode layer 111 is formed.

The gate insulating film 102a, the gate insulating film 102b which is in contact with the semiconductor film 103, the semiconductor film 103, and the insulating film 106 which is to be the channel protective layer are stacked over the gate electrode layer 111 in this order. In this embodiment, a light-transmitting insulating material is selected for the gate insulating films (102a, 102b) and the insulating film 106. A silicon oxide film, a silicon nitride film, a silicon oxynitride film, or a silicon nitride oxide film can be used for formation of a light-transmitting insulating film. Note that the thickness, a formation method, or the like of the light-transmitting insulating film is set as in Embodiment 1.

Here, a silicon nitride film is formed by a plasma CVD method as the gate insulating film 102a, and a silicon oxide film is formed by a sputtering method as the gate insulating film 102b. The gate insulating film 102b, the semiconductor film 103, and the insulating film 106 to be the channel protective layer are successively formed to be stacked as in Embodiment 1. By the successive film formation, an interface of the stacked films can be formed in the channel formation region and a back channel without being contaminated by an atmospheric component such as water vapor and impurity elements and dusts which float in the air. As a result, variations in thin film transistor characteristics can be reduced and off current can be suppressed. Note that, since oxide containing In, Ga, and Zn (IGZO) is a material whose band gap is large, the semiconductor film 103 using IGZO transmits light well.

Next, a positive photoresist film is formed by spin coating over the insulating film 106. In a structure formed through the steps described above, since only the gate electrode layer 111 has a light-shielding property, if the photoresist film is exposed to light from the substrate 100 side, only a region overlapping with the gate electrode layer 111 of the photoresist film is not exposed to the light. That is, the gate insulating film functions as a photomask, and the resist mask 117 is formed in the region overlapping with the gate electrode layer (see FIG. 3A).

Next, the insulating film 106 is etched using the resist mask 117 to form the channel protective layer 116. Note that, in etching the channel protective layer 116, the surface of the semiconductor film 103 may be slightly etched as illustrated in FIG. 3B. By etching the surface of the semiconductor film 103, favorable contact state between the semiconductor film 103 and the film 104 having n-type conductivity which is stacked over the semiconductor film 103 can be obtained.

Next, the film 104 having n-type conductivity which is to be buffer layers and the conductive film 105 to be source and drain electrode layers are stacked over the semiconductor film 103 and the channel protective layer 116 by a method similar to that in Embodiment 1.

Here, a three-layer film is formed by a sputtering method as the conductive film 105. For example, a three-layer film formed of a titanium film (105-1), an aluminum film (105-2), and a titanium film (105-3) can be used.

Next, the conductive film 105 formed using a three-layer film is etched using the resist mask 118 which is formed using a second photomask of this embodiment, whereby the source and drain electrode layers 115a and 115b are formed. The layer 115a is formed of layers 115a1, 115a2 and 115a3.

As in Embodiment 1, the film 104 having n-type conductivity is etched using the resist mask 118 to form the buffer layers 114a and 114b.

Further, an unnecessary portion of the semiconductor layer 113 is removed by etching using the resist mask 118 and the channel protective layer 116 as masks. FIG. 3D illustrates a state in which a surface of the channel protective layer 116 is slightly etched to have a depressed shape in accordance with etching of the film 104 having n-type conductivity and the semiconductor film 103; however, it is acceptable as long as damage to a channel formation portion is prevented. Further, FIG. 3D illustrates a state in which the thickness of the gate insulating film 102b which is outside the thin film transistor is reduced or removed; however, it is acceptable as long as the gate insulating film in an inside of the thin film transistor remains.

The semiconductor layer 113 which is formed is subjected to heat treatment in a similar manner to Embodiment 1.

In the present invention, since the resist mask 117 is formed using the gate electrode layer 111 as a photomask, the number of photomasks that are used can be reduced, and misalignment is not generated. Further, since the channel formation region of the semiconductor layer 113 is protected by the channel protective layer 116, the conductive film 105 to be source and drain electrode layers, the film 104 having n-type conductivity to be buffer layers, and the semiconductor film 103 can be etched using the resist mask 118 which is manufactured using the second photomask, and thus a process can be simplified.

Accordingly, by application of an embodiment of the present invention, a thin film transistor with a small photocurrent, low parasitic capacitance, and a high on/off ratio can be obtained, and the thin film transistor having dynamic characteristics (f characteristics) can be manufactured with high yield. In addition, a semiconductor device including the thin film transistor with high electric characteristics and high reliability can be provided by a method with excellent productivity.

Embodiment 3

In this embodiment, a method for manufacturing a thin film transistor in which an IGZO semiconductor layer having a structure in which a plurality of channel formation regions are connected is used is described with reference to FIGS. 5A to 5D.

Figure 5A:
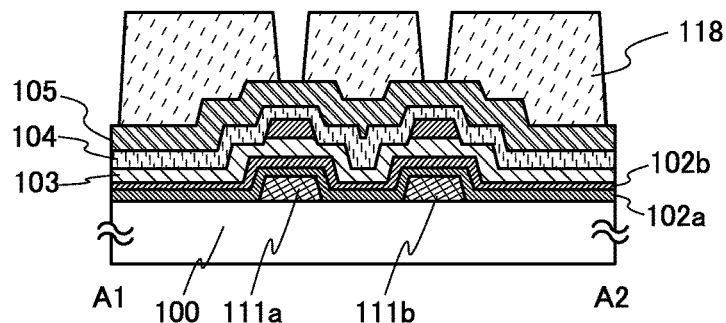
FIGS. 5A to 5D are diagrams illustrating a semiconductor device to which an embodiment of the present invention is applied.
Figure 5B:
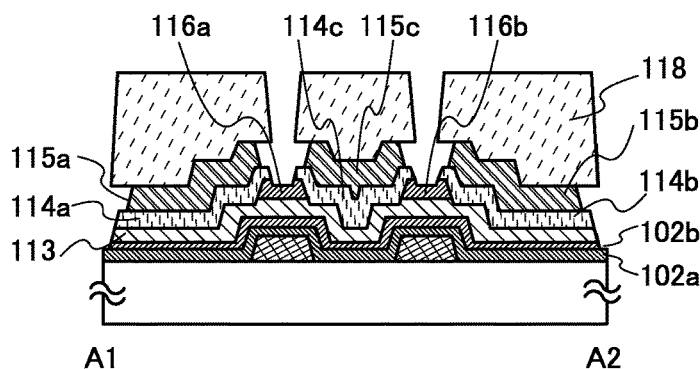
Figure 5C:
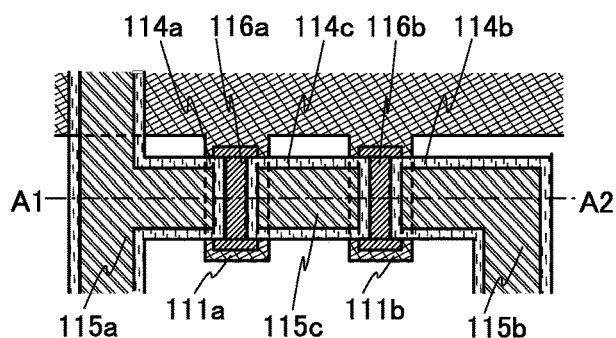
Figure 5D:
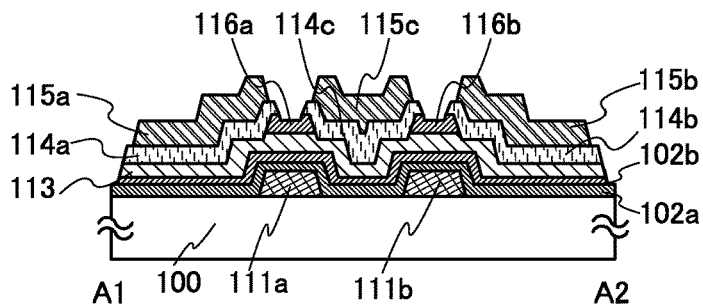

FIG. 5A is a cross-sectional view illustrating a state in which the resist mask is formed over the conductive film 105 using a third photomask of this embodiment. FIG. 5B is a cross-sectional view illustrating a state in which the conductive film 105, the film 104 having n-type conductivity, and the semiconductor film 103 are etched. FIG. 5C is a plane view illustrating a completed TFT, and FIG. 5D is a cross-sectional view taken along a line A1-A2 in FIG. 5C. Note that, in this embodiment, the same reference numerals are used for the same portions as those in Embodiment 1 and detailed description of the portions is omitted.

Gate electrode layers 111a and 111b are formed over the substrate 100 as in Embodiment 1 using a resist mask which is formed using a first photomask of this embodiment. Next, the gate insulating film 102a is formed over the gate electrode layers 111a and 111b. Next, the gate insulating film 102b which is in contact with the semiconductor film 103, the semiconductor film 103, and the insulating film 106 to be channel protective layers are successively formed by a sputtering method.

Channel protective layers 116a and 116b are formed in a region overlapping with the channel formation region of the semiconductor layer using a resist mask which is formed using a second photomask of this embodiment.

Next, the film 104 having n-type conductivity which is to be buffer layers and the conductive film 105 to be source and drain electrode layers are stacked over the semiconductor film 103 and the channel protective layer 116a and 116b by a method similar to that in Embodiment 1.

After the resist mask is formed using the third photomask of this embodiment as illustrated in FIG. 5A, the conductive film 105, the film 104 having n-type conductivity, and the semiconductor film 103 are etched. The conductive film 105 forms the source and drain electrode layers (115a, 115b) and a conductive layer 115c which connects two channel formation regions, the film 104 having n-type conductivity forms the buffer layers 114a and 114b and a layer 114c having n-type conductivity which connects the two channel formation regions, and the semiconductor film 103 is etched to form the semiconductor layer 113 (see FIG. 5B). Note that FIG. 5D illustrates a state in which end portions of the source and drain electrode layers (115a, 115b) are recessed than the buffer layers (114a, 114b). With the end portions of the source and drain electrode layers (115a, 115b) recessed, short-circuit between the source electrode and the drain electrode is not easily generated.

Note that, although a structure in which two channel formation regions are connected is employed in this embodiment, an embodiment of the present invention is not limited thereto, and a so-called multi-gate structure (a structure having two or more channel formation regions which are connected in series) such as a triple-gate structure in which three channel formation regions are connected may be employed.

Further, the two channel formation regions of the thin film transistor described in this embodiment are electrically connected to each other through the semiconductor layer 113, the layer 114c having n-type conductivity, and the conductive layer 115c.

Further, the semiconductor layer 113 which is formed is subjected to heat treatment in a similar manner to Embodiment 1.

In the present invention, the channel formation region of the semiconductor layer 113 is protected by the channel protective layer 116a and 116b. Further, the conductive film 105 to be source and drain electrode layers, the film 104 having n-type conductivity which is to be buffer layers, and the semiconductor film 103 can be etched using the resist mask 118 which is manufactured using the third photomask, and thus a process can be simplified. Furthermore, such a multi-gate structure is extremely effective for reducing an off current value.

Accordingly, by application of an embodiment of the present invention, a thin film transistor with a small photocurrent, low parasitic capacitance, and a high on/off ratio can be obtained, and the thin film transistor having dynamic characteristics (f characteristics) can be manufactured with high yield. In addition, a semiconductor device including the thin film transistor with high electric characteristics and high reliability can be provided by a method with excellent productivity.

Embodiment 4

In this embodiment, a manufacturing example of an inverted-staggered thin film transistor is described, in which at least a gate insulating film and an oxide semiconductor film are formed to be stacked successively without being exposed to the air. In this embodiment, steps up to a step of the successive film formation are described and steps after the successive film formation may be performed in accordance with any one of Embodiments 1 to 3 to manufacture a thin film transistor.

Figure 6:
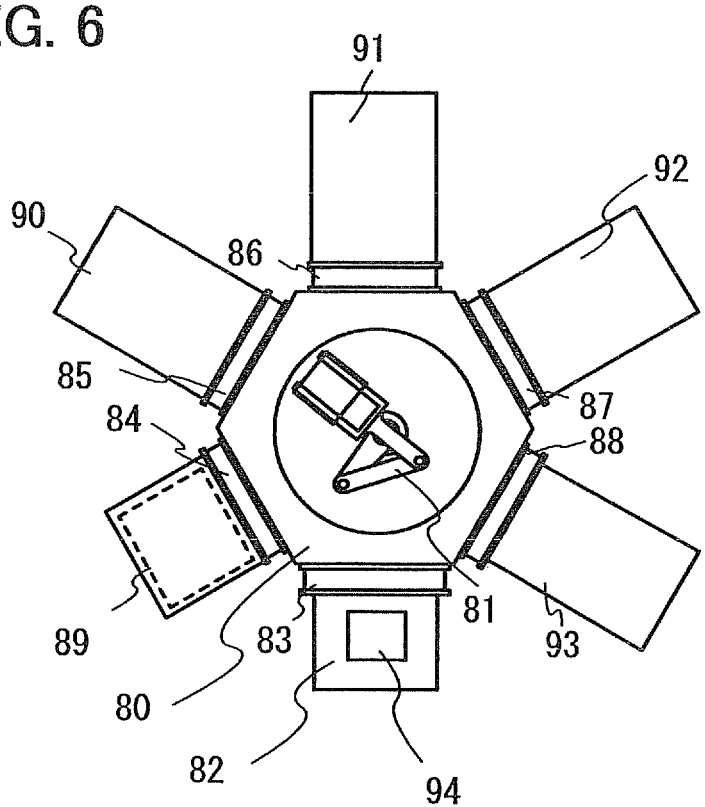
FIG. 6 is a top schematic diagram illustrating a multi-chamber manufacturing apparatus.

When films are successively formed without being exposed to the air, such a multi-chamber manufacturing apparatus illustrated in FIG. 6 is preferably used.

At the center of the manufacturing apparatus, a transfer chamber 80 equipped with a transfer mechanism for transferring a substrate (typically, a transfer robot 81) is provided. A cassette chamber 82 in which a cassette case holding a plurality of substrates carried into and out of the transfer chamber 80 is set is connected to the transfer chamber 80.

In addition, a plurality of treatment chambers are connected to the transfer chamber through gate valves 83 to 88. In this embodiment, an example in which five treatment chambers are connected to the transfer chamber 80 having a hexagonal top shape is illustrated. Note that by changing the top shape of the transfer chamber, the number of treatment chambers which can be connected to the transfer chamber can be changed. For example, three treatment chambers can be connected to a transfer chamber having a tetragonal shape, or seven treatment chambers can be connected to a transfer chamber having an octagonal shape.

At least one treatment chamber among the five treatment chambers is a sputtering chamber in which sputtering is performed. The sputtering chamber is provided with, at least inside the chamber, a sputtering target, a mechanism for applying electric power or a gas introduction means for sputtering the target, a substrate holder for holding a substrate at a predetermined position, and the like. Further, the sputtering chamber is provided with a pressure control means for controlling the pressure in the chamber, so that the pressure is reduced in the sputtering chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited at the same time by electric discharge in the same chamber.

In addition, there are also a sputtering apparatus provided with a magnet system inside the chamber and used for a magnetron sputtering method, and a sputtering apparatus used for an ECR sputtering method in which plasma generated with the use of microwaves is used without using glow discharge.

In the sputtering chamber of this embodiment, any of various sputtering methods described above is used as appropriate. In addition, as a deposition method, there are also a reactive sputtering method in which a target substance and a sputtering gas component are chemically reacted with each other during deposition to form a thin compound film thereof, and a bias sputtering method in which a voltage is also applied to a substrate during deposition.

In addition, among the five treatment chambers, one of the other treatment chambers than the sputtering chamber is a heating chamber in which a substrate is preheated or the like before sputtering, a cooling chamber in which a substrate is cooled after sputtering, or a chamber in which plasma treatment is performed.

Next, an example of an operation of the manufacturing apparatus is described.

A substrate cassette storing a substrate 94 whose surface on which deposition is performed faces downward is set in the cassette chamber 82, and the cassette chamber 82 is placed in a reduced pressure state by a vacuum evacuation means provided in the cassette chamber 82. Note that in each of the treatment chambers and the transfer chamber 80, the pressure is reduced in advance by a vacuum evacuation means provided in each chamber. Accordingly, during being transferred between the treatment chambers, the substrate is not exposed to the air and can be kept clean.

Note that at least a gate electrode is provided in advance over the substrate 94 surface on which deposition is performed faces downward. For example, a base insulating film such as a silicon nitride film or a silicon nitride oxide film may also be provided by a plasma CVD method between the substrate and the gate electrode. When a substrate made of glass containing alkali metal is used as the substrate 94, the base insulating film has an effect of preventing movable ions such as sodium ions from being discharged from the substrate and entering a semiconductor region above the substrate to change electric characteristics of a TFT.

Here, a substrate over which a silicon nitride film covering the gate electrode is formed by a plasma CVD method to form a first layer of a gate insulating film is used. The silicon nitride film formed by a plasma CVD method is dense, so that generation of pin holes or the like can be suppressed by using this silicon nitride film as the first layer of the gate insulating film. Although this embodiment describes an example in which the gate insulating film has a layered structure, the present invention is not limited thereto, and the gate insulating film may be a single layer or have a layered structure including three or more layers.

Then, the gate valve 83 is opened and the substrate 94 which is the first substrate is picked up from the cassette by the transfer robot 81. After that, the gate valve 84 is opened and the substrate 94 is transferred to a first treatment chamber 89, and then, the gate valve 84 is closed. In the first treatment chamber 89, by heating the substrate 94 by a heater or a lamp, moisture or the like attached to the substrate 94 is removed. In particular, when the gate insulating film contains moisture, electric characteristics of a TFT could possibly be changed; therefore, heating before sputtering deposition is effective. Note that in the case where moisture has been sufficiently removed at the time when the substrate is set in the cassette chamber 82, this heating treatment is not necessary.

In addition, plasma treatment may be performed on the surface of the first layer of the gate insulating film by providing a plasma treatment means in the first treatment chamber 89. Furthermore, heating for removing moisture may be performed in the cassette chamber 82 by providing a heating means in the cassette chamber 82.

Then, the gate valve 84 is opened and the substrate is transferred to the transfer chamber 80 by the transfer robot 81. After that, the gate valve 85 is opened and the substrate is transferred to a second treatment chamber 90, and the gate valve 85 is closed.

Here, the second treatment chamber 90 is a sputtering chamber in which sputtering is performed using an RF magnetron sputtering method. In the second treatment chamber 90, a silicon oxide film ($SiO_x$ film (x>0)) is formed as a second layer of the gate insulating film. Alternatively, for the second layer of the gate insulating film, an aluminum oxide film ($Al_2O_3$ film), a magnesium oxide film ($MgO_x$ film (x>0)), an aluminum nitride film ($AlN_x$ film (x>0)), an yttrium oxide film ($YO_x$ film (x>0)), or the like may be used instead of a silicon oxide film.

A small amount of a halogen element such as fluorine or chlorine may be added to the second layer of the gate insulating film so that movable ions such as sodium ions can be immobilized. As a method for adding a small amount of a halogen element, sputtering is performed by introducing a gas containing a halogen element into the chamber. Note that in the case where a gas containing a halogen element is introduced, the evacuation means of the chamber is needed to be provided with an abatement system. The peak of the concentration of a halogen element to be contained in the gate insulating film is measured by a secondary ion mass spectrometer (SIMS) and is preferably in the range of from $1 \times 10^{15}$ cm$^{-3}$ to $1 \times 10^{20}$ cm$^{-3}$.

When the $SiO_x$ film (x>0) is formed, a sputtering method in which artificial quartz is used as a target and a rare gas, typically, argon is used, or a reactive sputtering method in which single crystal silicon is used as a target and chemically reacted with an oxygen gas to obtain a $SiO_x$ film (x>0) can be used. Here, artificial quartz is used as a target, and sputtering is performed in an atmosphere containing only oxygen, an atmosphere containing oxygen at 90% or more and Ar at 10% or less so that a $SiO_x$ film contains oxygen as much as possible. Thus, a $SiO_x$ film (x>0) containing excessive oxygen is formed.

After the $SiO_x$ film (x>0) is formed, the gate valve 85 is opened, and the substrate is transferred to the transfer chamber 80 by the transfer robot 81 without being exposed to the air. Then, the gate valve 86 is opened, the substrate is transferred to a third treatment chamber 91, and the gate valve 86 is closed.

In this embodiment, the third treatment chamber 91 is a sputtering chamber in which sputtering is performed using a DC magnetron sputtering method. In the third treatment chamber 91, an oxide semiconductor film containing In, Ga, and Zn (IGZO film) is formed as a semiconductor layer. The IGZO film can be formed using an oxide semiconductor target containing In, Ga, and Zn, under a rare gas atmosphere or an oxygen atmosphere. Here, an oxide semiconductor containing In, Ga, and Zn is used as a target and sputtering is performed by a pulsed DC sputtering method under an atmosphere containing only oxygen, an atmosphere containing oxygen at 90% or more and Ar at 10% or less so that the IGZO film contains oxygen as much as possible. Thus, an IGZO film containing excessive oxygen is formed.

By thus successively forming the $SiO_x$ film (x>0) containing excessive oxygen and the IGZO film containing excessive oxygen without exposing them to the air, an interface state between the films can be stabilized because both the films contain excessive oxygen, and the reliability of a TFT can be improved. If the substrate is exposed to the air before formation of the IGZO film, moisture or the like is attached and the interface state is adversely affected, which may cause phenomena such as variation in threshold voltage, degradation in electric characteristics, and a normally-on TFT. Moisture is a hydrogen compound. When the films are successively formed without being exposed to the air, the hydrogen compound can be prevented from existing at the interface. Therefore, by successive film formation, variation in threshold voltage can be reduced, degradation in electric characteristics can be prevented, or shift of the TFT characteristics to the normally-on side can be reduced, desirably, the shift of the TFT characteristics can be prevented.

In addition, in the second treatment chamber 90 which is a sputtering chamber, both an artificial quartz target and an oxide semiconductor target containing In, Ga, and Zn are placed, and the films are successively formed by using a shutter; therefore, the films can be stacked in the same chamber. A shutter is provided between the target and the substrate; a shutter is opened for a target which is deposited, and a target which is not deposited is shielded by a shutter. Advantages of the process in which the films are stacked in the same chamber are as follows: the number of chambers which are used can be reduced, and particles or the like can be prevented from being attached to the substrate during transfer of the substrate between different chambers.

Next, the substrate is transferred to the transfer chamber 80 with the transfer robot 81 by opening the gate valve 86 and transferred to a fourth treatment chamber 92 by opening a gate valve 87 without being exposed to the air, and then the gate valve 87 is closed.

Here, the fourth treatment chamber 92 is a sputtering chamber in which sputtering is performed using an RF magnetron sputtering method. In the fourth treatment chamber 92, a silicon oxide film ($SiO_x$ film (x>0)) is formed as an insulating film to be a channel protective layer. Alternatively, for the channel protective layer, an aluminum oxide film ($Al_2O_3$ film), a magnesium oxide film ($MgO_x$ film (x>0)), an aluminum nitride film ($AlN_x$ film (x>0)), an yttrium oxide film ($YO_x$ film (x>0)), or the like may be used instead of a silicon oxide film.

A small amount of a halogen element such as fluorine or chlorine may be added to the channel protective layer so that movable ions such as sodium ions can be immobilized. As a method for adding a small amount of a halogen element, sputtering is performed by introducing a gas containing a halogen element into the chamber. Note that in the case where a gas containing a halogen element is introduced, the evacuation means of the chamber is needed to be provided with an abatement system. The peak of the concentration of a halogen element to be contained in the channel protective layer is measured by a secondary ion mass spectrometer (SIMS) and is preferably in the range of from $1\times10^{15}$ cm$^{-3}$ to $1\times10^{20}$ cm$^{-3}$.

When the $SiO_x$ film (x>0) is formed for the channel protective layer, a sputtering method in which artificial quartz is used as a target and a rare gas, typically, argon is used, or a reactive sputtering method in which single crystal silicon is used as a target and chemically reacted with an oxygen gas to obtain a $SiO_x$ film (x>0) can be used. Here, artificial quartz is used as a target, and sputtering is performed in an atmosphere containing only oxygen, an atmosphere containing oxygen at 90% or more and Ar at 10% or less so that a $SiO_x$ (x>0) film contains oxygen as much as possible. Thus, a $SiO_x$ film (x>0) containing excessive oxygen is formed.

By thus successively forming the $SiO_x$ film (x>0) containing excessive oxygen and the IGZO film containing excessive oxygen without exposing them to the air, an interface state between the films can be stabilized because all the three films contain excessive oxygen, and the reliability of a TFT can be improved. If the substrate is exposed to the air before formation of the IGZO film, moisture or the like is attached and the interface state is adversely affected, which may cause phenomena such as variation in threshold voltage, degradation in electric characteristics, and a normally-on TFT. Moisture is a hydrogen compound. When the films are successively formed without being exposed to the air, the hydrogen compound can be prevented from existing at the interface of the IGZO film. Therefore, by forming the three films successively, variation in threshold voltage can be reduced, degradation in electric characteristics can be prevented, or shift of the TFT characteristics of a TFT to the normally-on side can be reduced, desirably, the shift of the TFT characteristics can be prevented.

In addition, in the second treatment chamber 90 which is a sputtering chamber, both an artificial quartz target and an oxide semiconductor target containing In, Ga, and Zn are placed, and the three films are successively formed by using a shutter; therefore, the films can be stacked in the same chamber. Advantages of the process in which the films are stacked in the same chamber are as follows: the number of chambers which are used can be reduced, and particles or the like can be prevented from being attached to the substrate during transfer of the substrate between different chambers.

After the above steps for deposition on a substrate in a cassette case are repeated so that a plurality of substrates are processed, the vacuum in the cassette chamber is released and the substrates and the cassettes are taken out.

Next, the channel protective layer is etched so that only a portion thereof overlapping with the gate electrode, that is, only a portion thereof overlapping with a portion to be a channel formation region of the IGZO film is left. Here, the channel protective layer is etched under the condition that the etching rate is sufficiently different from that of the IGZO film. In the case where there is not a sufficient difference in etching rate between the channel protective layer and the IGZO film in etching the channel protective layer, the surface portion of the IGZO film is partially etched and thus a region thinner than a region overlapped with the channel protective layer is formed in the IGZO film.

Next, the substrate is set in the cassette chamber of the multi-chamber manufacturing apparatus illustrated in FIG. 6 again.

Next, after pressure in the cassette chamber is reduced, the substrate is transferred to the transfer chamber 80 and then to the third treatment chamber 91. Here, sputtering is performed by a pulsed DC sputtering method in an atmosphere containing only a rare gas, so that the film having n-type conductivity to be a buffer layer is formed. The film having n-type conductivity functions as source and drain regions.

Next, the substrate is transferred to the transfer chamber 80 with the transfer robot 81 by opening the gate valve 87 and transferred to a fifth treatment chamber 93 by opening a gate valve 88 without being exposed to the air, and then the gate valve 88 is closed.

Here, the fifth treatment chamber 93 is a sputtering chamber using a DC magnetron sputtering method. In the fifth treatment chamber 93, a metal multilayer film to be source and drain electrodes is formed. The sputtering chamber of the fifth treatment chamber 93 is provided with both a titanium target and an aluminum target and successive film formation is performed by using a shutter; thus, films are formed in the same chamber. Here, an aluminum film is stacked over a titanium film and further, a titanium film is stacked over the aluminum film.

By thus successively forming a film having n-type conductivity and a metal multilayer film without exposing them to the air, a favorable interface state can be achieved and contact resistance can be reduced between the film having n-type conductivity and the metal multilayer film.

After the above steps for deposition on a substrate in a cassette case are repeated so that a plurality of substrates are processed, the vacuum in the cassette chamber is released and the substrates and the cassettes are taken out.

Next, the metal multilayer film is selectively etched to form the source and drain electrodes. Further, the film having n-type conductivity and the oxide semiconductor film containing In, Ga, and Zn are selectively etched using the source and drain electrodes as masks, so that source and drain regions and the semiconductor layer are formed. In the etching of the film having n-type conductivity and the oxide semiconductor film containing In, Ga, and Zn, the channel protective layer functions as an etching stopper. Further, in this embodiment, the gate insulating film is a two-layer film in which the upper layer is a $SiO_x$ (x>0) film which may be removed, but the lower layer is a silicon nitride film functioning as an etching stopper.

Through the above steps, the inverted-staggered thin film transistor including the channel protective layer can be formed.

Although an example is described in which the IGZO film containing excessive oxygen and the film having n-type conductivity are formed in the same chamber through the above steps, the present invention is not particularly limited to this. Alternatively, the IGZO film containing excessive oxygen and the film having n-type conductivity may be formed in different chambers.

In this embodiment, a multi-chamber manufacturing apparatus is shown as an example, but an in-line manufacturing apparatus in which sputtering chambers are connected in series may be used and successive film formation may be performed without being exposed to the air.

The apparatus illustrated in FIG. 6 has a so-called facedown treatment chamber in which the deposition target surface of the substrate faces downward, but may also have a vertical placement treatment chamber in which a substrate is placed vertically. The vertical placement treatment chamber has an advantage in that a footprint is smaller than that of a face-down treatment chamber and can be effectively used in the case where a large-area substrate which could be bent due to its weight is used.

Embodiment 5

In this embodiment, an example will be described below in which at least a part of a driver circuit and a thin film transistor to be disposed in a pixel portion are formed over one substrate.

The thin film transistor to be disposed in the pixel portion is formed according to any of Embodiments 1 to 3. Further, the thin film transistor described in any of Embodiments 1 to 3 is an n-channel TFT, and thus a part of a driver circuit that can include an n-channel TFT among driver circuits is formed over the same substrate as the thin film transistor of the pixel portion.

Figure 7A:
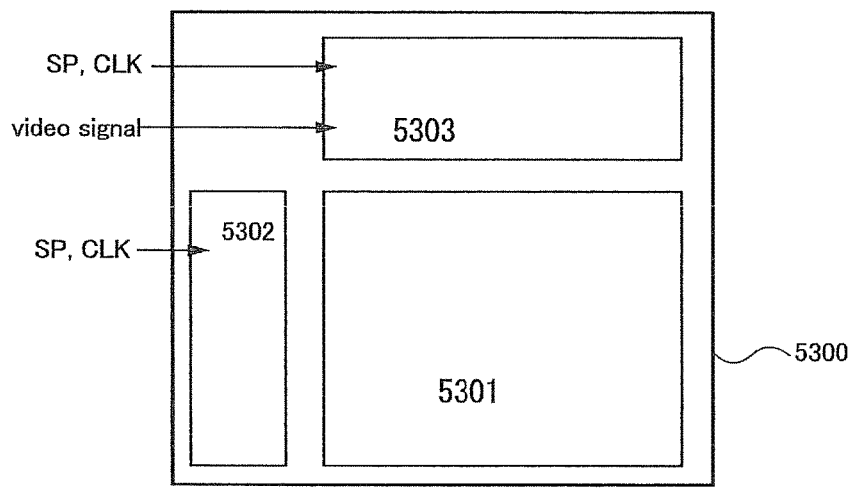
FIGS. 7A and 7B are block diagrams each illustrating a display device.

FIG. 7A illustrates an example of a block diagram of an active matrix liquid crystal display device. The display device illustrated in FIG. 7A includes, over a substrate 5300, a pixel portion 5301 including a plurality of pixels each provided with a display element; a scan line driver circuit 5302 that selects each pixel; and a signal line driver circuit 5303 that controls a video signal input to a selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gm. Each pixel is connected to a signal line Sj (any one of the signal lines S1 to Sm) and a scan line Gi (any one of the scan lines G1 to Gn).

In addition, the thin film transistor described in any of Embodiments 1 to 3 is an n-channel TFT, and a signal line driver circuit including the n-channel TFT is described with reference to FIG. 8.

Figure 8:
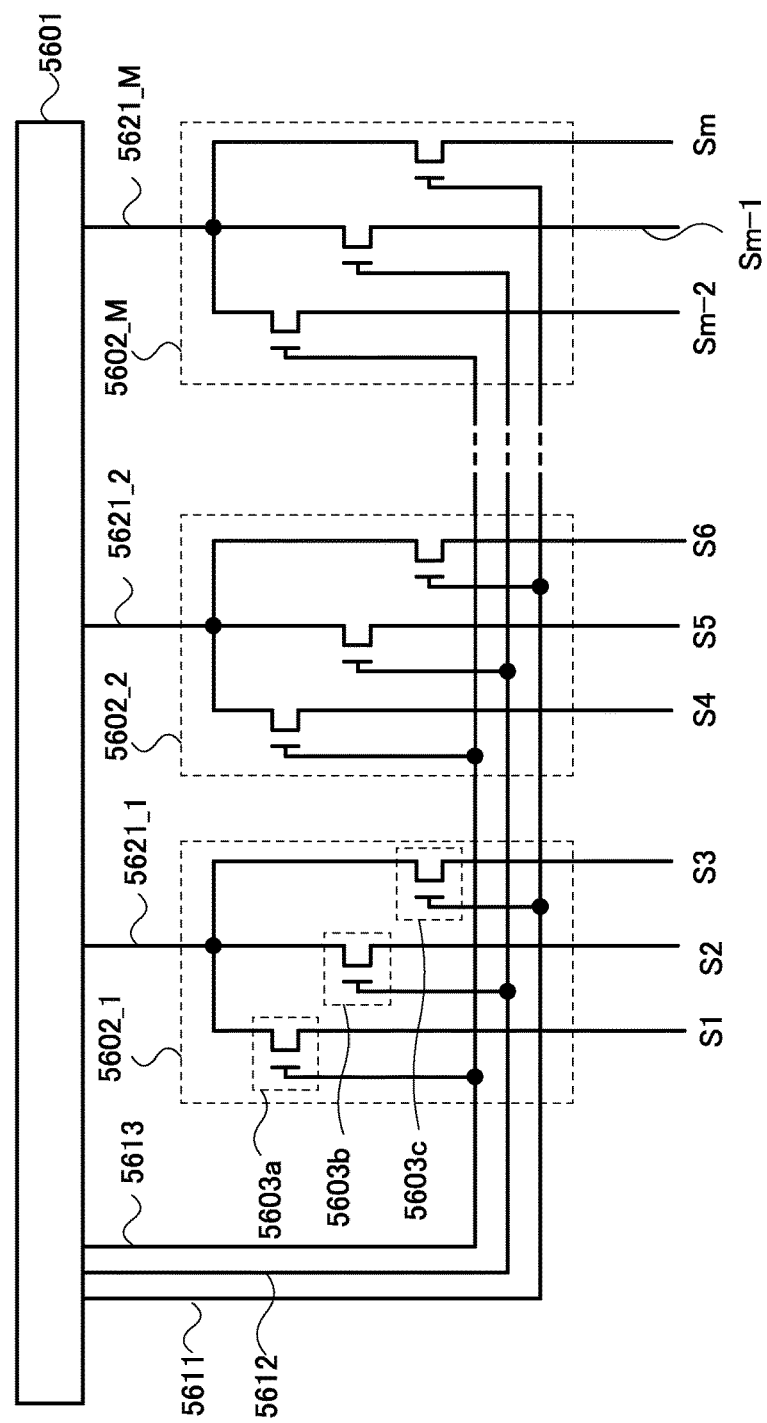
FIG. 8 is a diagram illustrating a structure of a signal line driver circuit.

The signal line driver circuit illustrated in FIG. 8 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. The switch groups 5602_1 to 5602_M are connected to the wirings 5621_1 to 5621_M corresponding to the switch groups 5602_1 to 5602_M, respectively, and are each connected to the first wiring 5611, the second wiring 5612, and the third wiring 5613. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

Note that a signal is input to each of the first wiring 5611, the second wiring 5612, and the third wiring 5613.

Note that the driver IC 5601 is desirably formed over a single crystalline substrate. The switch groups 5602_1 to 5602_M are desirably formed over the same substrate as the pixel portion illustrated in any of Embodiments 1 to 3. Therefore, the driver IC 5601 and the switch groups 5602_1 to 5602_M are preferably connected via an FPC or the like.

Figure 9:
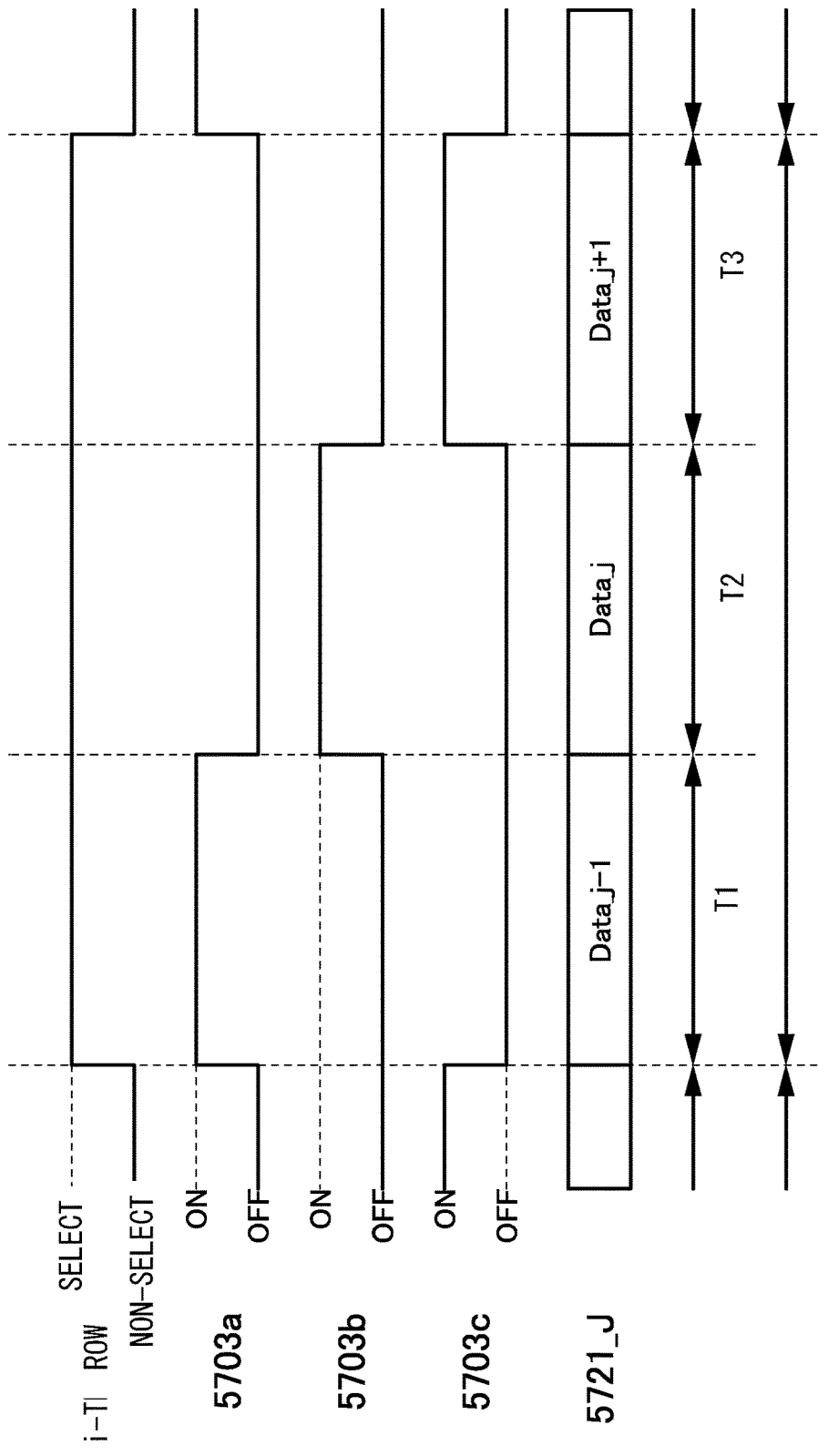
FIG. 9 is a timing chart showing operation of a signal line driver circuit.

Next, operation of the signal line driver circuit illustrated in FIG. 8 is described with reference to a timing chart in FIG. 9. Note that the timing chart in FIG. 9 shows the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 8 operates as in FIG. 9 even when a scan line of another row is selected.

Note that the timing chart in FIG. 9 shows the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 9 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

Note that in the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1.

As illustrated in FIG. 9, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 8, by dividing one gate selection period into three, video signals can be input to three signal lines from one wiring 5621 in one gate selection period. Therefore, in the signal line driver circuit in FIG. 8, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 8 can be improved.

Note that there are no particular limitations on the arrangement, the number, a driving method, and the like of the thin film transistors, as long as one gate selection period can be divided into a plurality of sub-selection periods and video signals can be input to a plurality of signal lines from one wiring in the respective sub-selection periods as illustrated in FIG. 8.

For example, when video signals are input to three or more signal lines from one wiring in each of three or more sub-selection periods, it is only necessary to add a thin film transistor and a wiring for controlling the thin film transistor. Note that when one selection period is divided into four or more sub-selection periods, one sub-selection period is shorter. Therefore, one selection period is desirably divided into two or three sub-selection periods.

Figure 10:
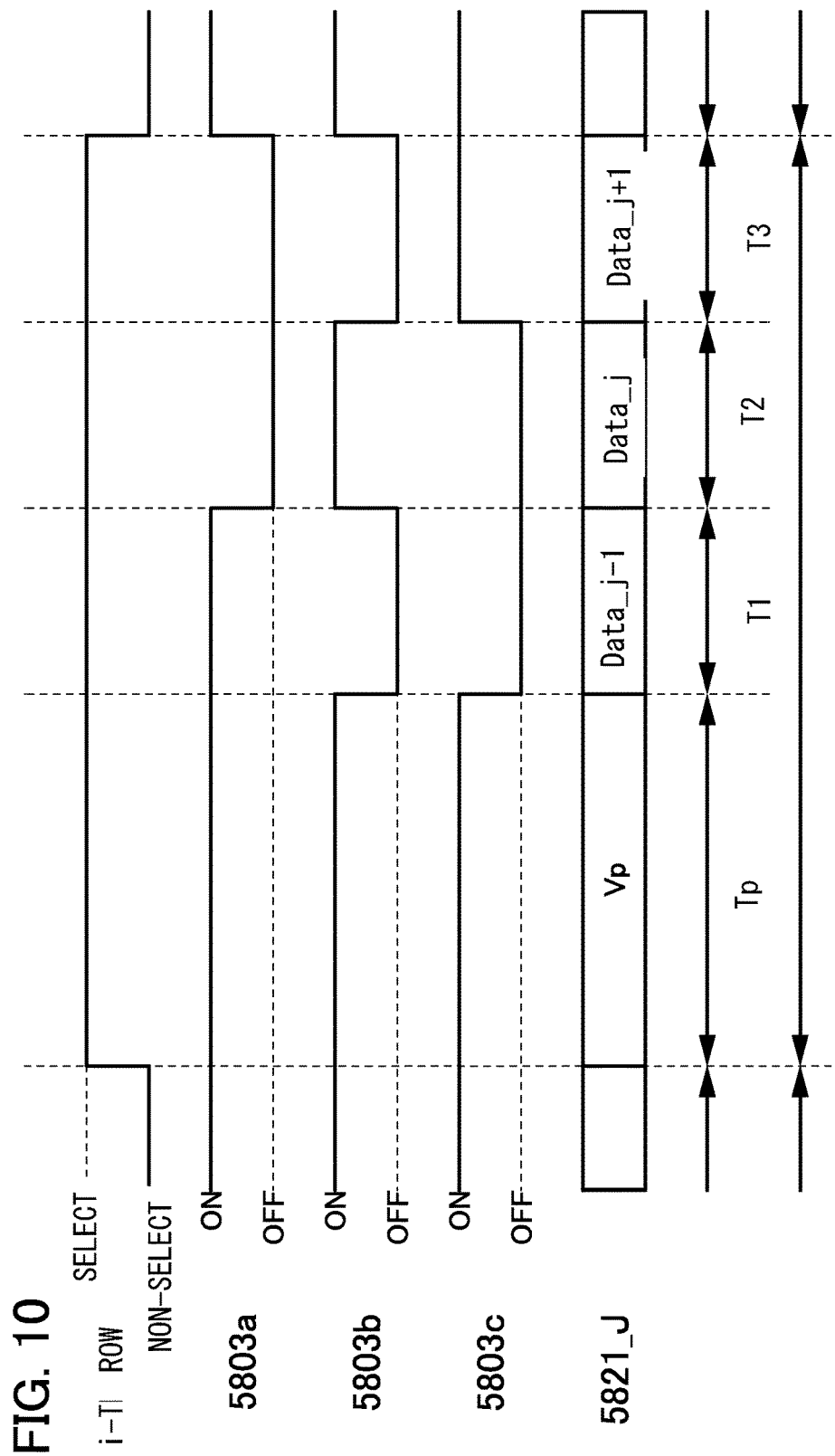
FIG. 10 is a timing chart showing operation of a signal line driver circuit.

As another example, one selection period may be divided into a precharge period Tp, the first sub-selection period T1, the second sub-selection period T2, and the third sub-selection period T3 as illustrated in a timing chart in FIG. 10. The timing chart in FIG. 10 shows timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 10, the first thin film transistor 5603a, the second thin film transistor 5603b, and the third thin film transistor 5603c are tuned on in the precharge period Tp. At this time, a precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 8 to which the timing chart in FIG. 10 is applied, the video signal can be written to the pixel at high speed because the signal line can be precharged by providing a precharge selection period before a sub-selection period. Note that portions in FIG. 10 which are similar to those of FIG. 9 are denoted by common reference numerals and detailed description of the portions which are the same and portions which have similar functions are omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer through which a large current can flow can be used.

One mode of a shift register which is used for a part of a scan line driver circuit is described with reference to FIG. 11 and FIG. 12.

Figure 11:
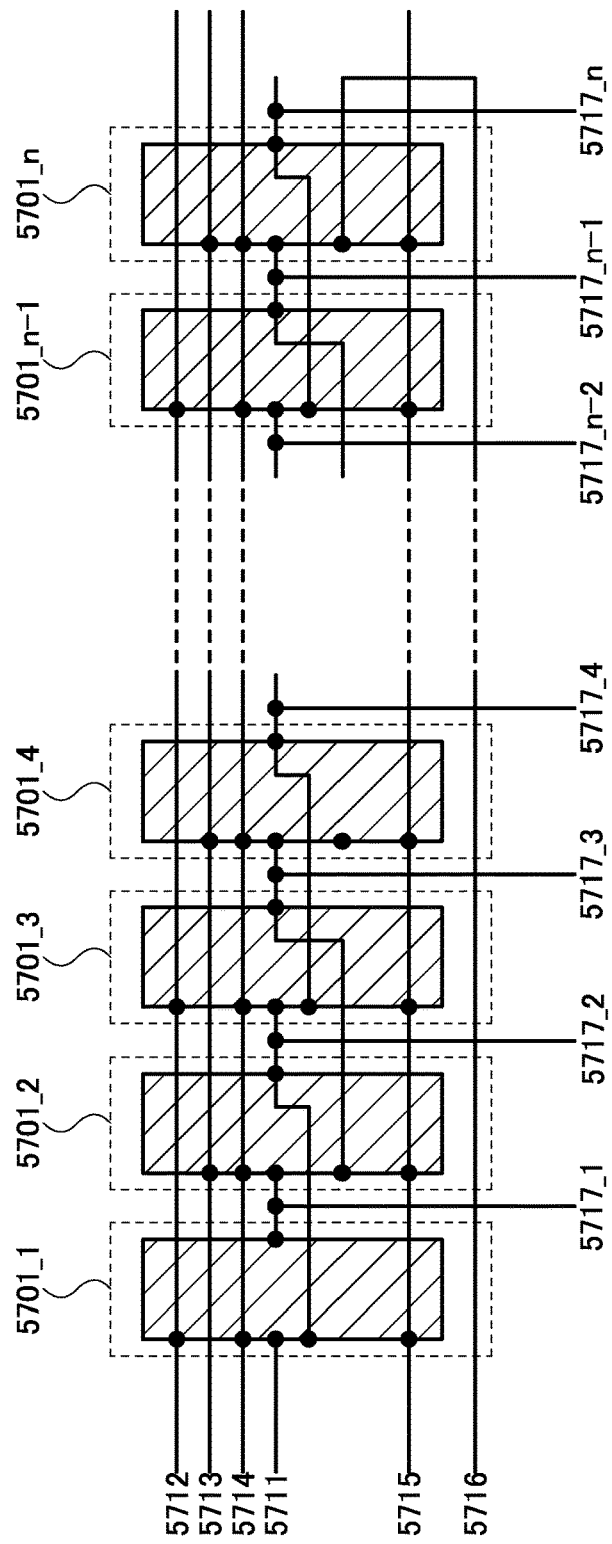
FIG. 11 is a diagram illustrating a structure of a shift register.

FIG. 11 illustrates a circuit configuration of a shift register. The shift register illustrated in FIG. 11 includes a plurality of flip-flops (flip-flops 5701_1 to 5701_n). The shift register is operated with input of a first clock signal, a second clock signal, a start pulse signal, and a reset signal.

Connection relations of the shift register in FIG. 11 are described. In the i-th stage flip-flop 5701_i (any one of the flip-flops 5701_1 to 5701_n) in the shift register of FIG. 11, a first wiring 5501 illustrated in FIG. 12 is connected to a seventh wiring 5717_i−1; a second wiring 5502 illustrated in FIG. 12 is connected to a seventh wiring 5717_i+1; a third wiring 5503 illustrated in FIG. 12 is connected to a seventh wiring 5717_i; and a sixth wiring 5506 illustrated in FIG. 12 is connected to a fifth wiring 5715.

Figure 12:
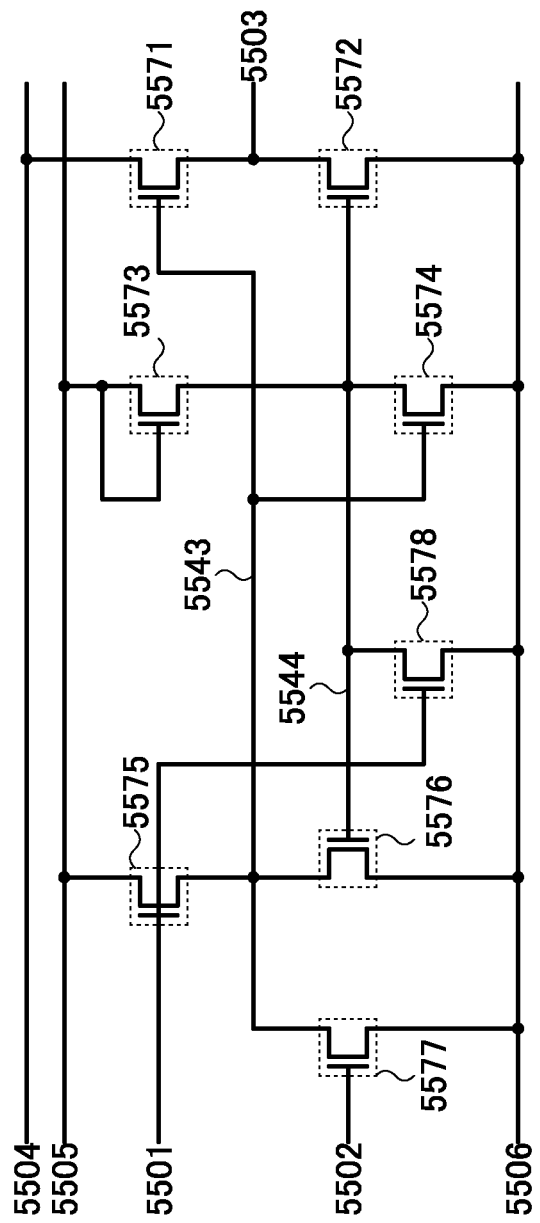
FIG. 12 is a diagram illustrating a connecting structure of flip-flops illustrated in FIG. 11.

Further, a fourth wiring 5504 illustrated in FIG. 12 is connected to a second wiring 5712 in flip-flops of odd-numbered stages, and is connected to a third wiring 5713 in flip-flops of even-numbered stages. A fifth wiring 5505 illustrated in FIG. 12 is connected to a fourth wiring 5714.

Note that the first wiring 5501 in FIG. 12 of the first stage flip-flop 5701_1 is connected to a first wiring 5711. Moreover, the second wiring 5502 in FIG. 12 of the n-th stage flip-flop 5701_n is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 12 illustrates details of the flip-flop illustrated in FIG. 11. The flip-flop illustrated in FIG. 12 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 11 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to the gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to a gate electrode of the second thin film transistor 5572.

A first electrode of the seventh thin film transistor 5577 is connected to the sixth wiring 5506. A second electrode of the seventh thin film transistor 5577 is connected to a gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in any of Embodiments 1 to 3. The n-channel TFT described in any of Embodiments 1 to 3 has a high mobility, and thus a driving frequency of a driver circuit can be increased. Further, in the case of the n-channel TFT described in any of Embodiments 1 to 3, since parasitic capacitance is reduced by a buffer layer, frequency characteristics (also referred to as f characteristics) are excellent. For example, a scan line driver circuit using the n-channel TFT described in any of Embodiments 1 to 3 can be operated at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

Figure 7B:
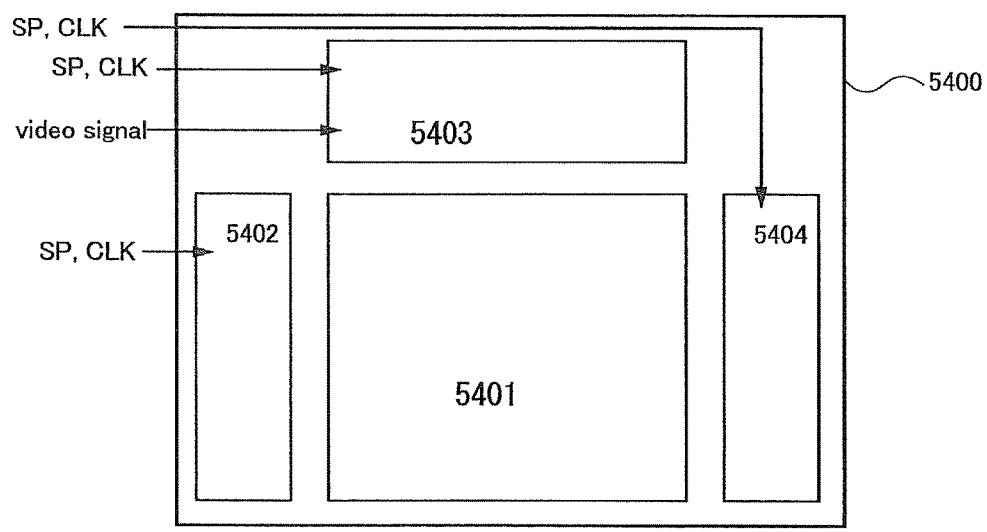

Further, when an active matrix light-emitting display device is manufactured, a plurality of thin film transistors are arranged in at least one pixel, and thus a plurality of scan line driver circuits are preferably arranged. FIG. 7B is a block diagram illustrating an example of an active matrix light-emitting display device.

The display device illustrated in FIG. 7B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the display device illustrated in FIG. 7B is a digital signal, the pixel emits or does not emit light by switching of on/off of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than the liquid crystal elements. Specifically, in the case of performing display with a time gray scale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of time, in which pixels actually emit light in one frame period, can be controlled with video signals so that gray scales can be displayed.

In the example of the display device illustrated in FIG. 7B, in the case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

In addition, also in the light-emitting device, a part of the driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in any of Embodiments 1 to 3.

Moreover, the above-described driver circuit can be used for electronic paper that drives electronic ink using an element electrically connected to a switching element, without being limited to applications to a liquid crystal display device or a light-emitting device. Electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. An electrophoretic display contains a plurality of microcapsules dispersed in a solvent or a solute, each of which contains first particles which are positive-charged and second particles which are negative-charged. By applying an electric field to the microcapsules, the particles in the microcapsules are moved in opposite directions to each other and only the color of the particles concentrated on one side is exhibited. Note that the first particles and the second particles each contain a pigment and do not move without an electric field. Moreover, the colors of the first particles and the second particles are different from each other (the colors include achromatic color).

In this way, an electrophoretic display is a display that utilizes a so-called dielectrophoretic effect by which a substance that has a high dielectric constant moves to a high-electric field region. An electrophoretic display does not need to use a polarizing plate and a counter substrate, which are required in a liquid crystal display device, and both the thickness and weight of the electrophoretic display device can be half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, with the use of a color filter or particles each containing a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained in Embodiment 2 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Embodiment 6

A thin film transistor to which an embodiment of the present invention is applied is manufactured, and a semiconductor device having a display function (also referred to as a display device) can be manufactured using the thin film transistor for a pixel portion and further for a driver circuit. Further, part or whole of a driver circuit can be formed over the same substrate as a pixel portion, using a thin film transistor to which an embodiment of the present invention is applied, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. The present invention relates to one mode of an element substrate before the display element is completed in a manufacturing process of the display device, and the element substrate is provided with a means for supplying a current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device will be described as an example of a semiconductor device to which an embodiment of the present invention is applied.

Figure 13A:
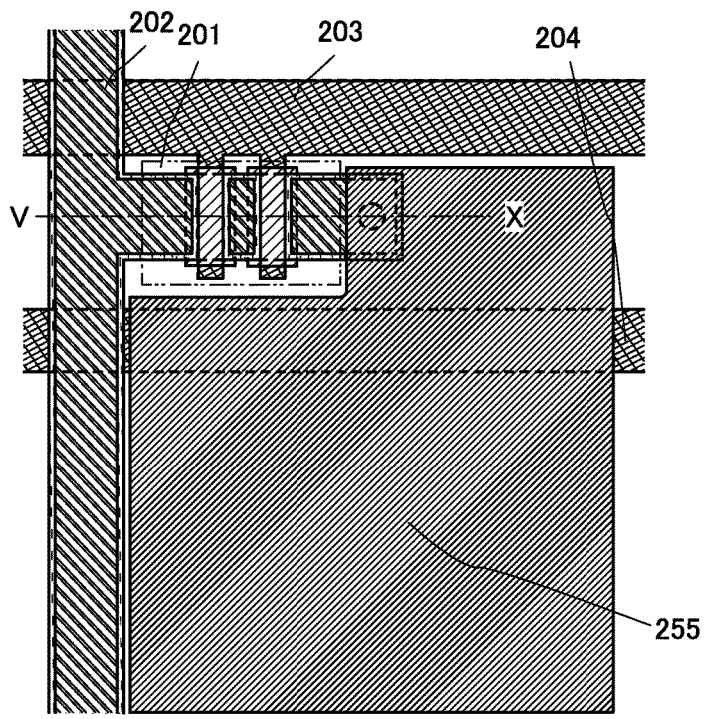
FIGS. 13A and 13B are diagrams illustrating a liquid crystal display device to which an embodiment of the present invention is applied.
Figure 13B:
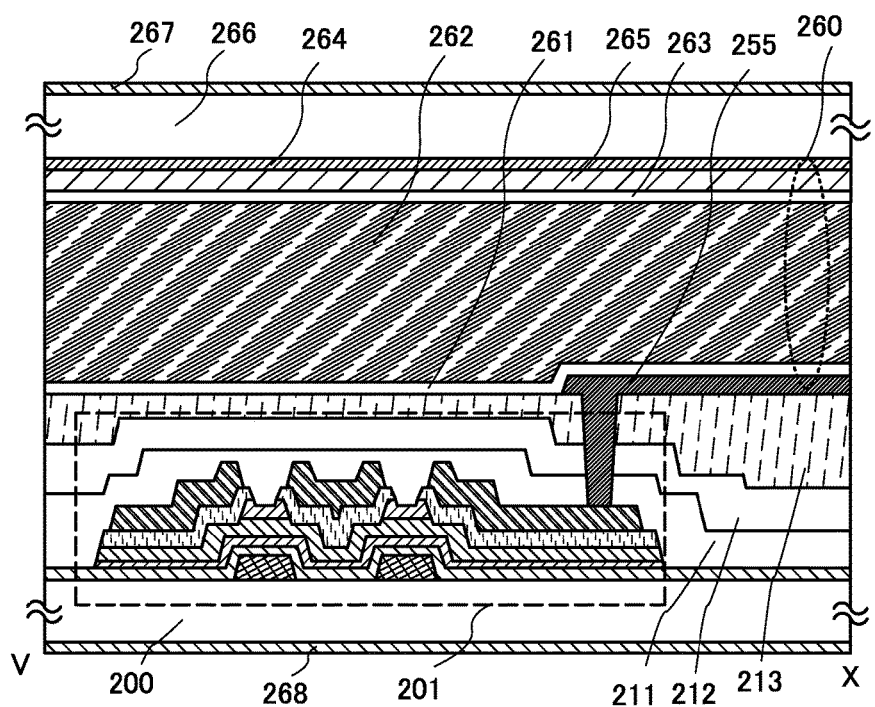

FIGS. 13A and 13B illustrate an active-matrix liquid crystal display device to which an embodiment of the present invention is applied. FIG. 13A is a plane view of the liquid crystal display device. FIG. 13B is a cross-sectional view taken along a line V-X in FIG. 13A. A thin film transistor 201 used in the semiconductor device can be manufactured similarly to the thin film transistor described in Embodiment 3 and is a highly reliable thin film transistor including an IGZO semiconductor layer and a buffer layer having n-type conductivity. The thin film transistors described in Embodiment 1 or 2 can also be used as the thin film transistor 201 of this embodiment.

The liquid crystal display device of this embodiment in FIG. 13A includes a source wiring layer 202, an inverted-staggered thin film transistor 201 with a multi-gate structure, a gate wiring layer 203, and a capacitor wiring layer 204.

Further, in FIG. 13B, in the liquid crystal display device of this embodiment, a substrate 200 provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268 and a substrate 266 provided with an insulating layer 263 serving as an alignment film, an electrode layer 265 used for a display element, a coloring layer 264 serving as a color filter, and a polarizing plate 267 face to each other with a liquid crystal layer 262 interposed therebetween; thus, a liquid crystal display element 260 is formed.

Although FIGS. 13A and 13B illustrate an example of a transmissive liquid crystal display device, an embodiment of the present invention can also be applied to a reflective liquid crystal display device and a transflective liquid crystal display device.

While FIGS. 13A and 13B illustrate an example of the liquid crystal display device in which the polarizing plate 267 is provided in a position outer than the substrate 266 (on the viewer side) and the coloring layer 264 and the electrode layer 265 used for a display element are provided in a position inner than the substrate 266 in that order, the polarizing plate 267 may be provided in a position inner than the substrate 266. The layered structure of the polarizing plate and the coloring layer is not limited to that shown in FIGS. 13A and 13B and may be set as appropriate depending on materials of the polarizing plate and the coloring layer or conditions of manufacturing steps. Further, a light-blocking film serving as a black matrix may be provided.

The electrode layers 255 and 265 each serving as a pixel electrode layer can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the electrode layers 255 and 265. The pixel electrode formed using the conductive composition preferably has a sheet resistivity of 10000 Ω/square or less and a transmittance of 70% or more at a wavelength of 550 nm. Further, the resistivity of the conductive high molecule contained in the conductive composition is preferably 0.1 Ω·cm or less.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Through the above process, a highly reliable liquid crystal display device as a semiconductor device can be manufactured.

This embodiment can be implemented by being combined with any of the structures described in other embodiments, as appropriate.

Embodiment 7

In this embodiment, an example of electronic paper will be described as a semiconductor device to which an embodiment of the present invention is applied.

Figure 14:
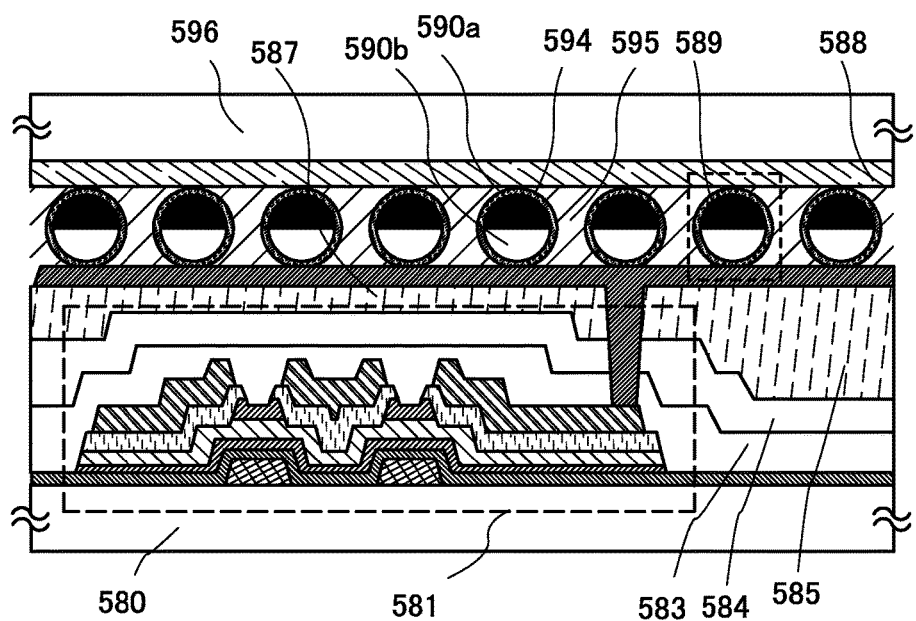
FIG. 14 is a diagram illustrating electronic paper to which an embodiment of the present invention is applied.

FIG. 14 illustrates active matrix electronic paper as an example of a semiconductor device to which an embodiment of the present invention is applied. A thin film transistor 581 used for the semiconductor device can be manufactured similarly to the thin film transistor described in Embodiment 3 and is a highly reliable thin film transistor including an IGZO semiconductor layer and a buffer layer having n-type conductivity. Alternatively, the thin film transistors described in Embodiment 1 or 2 may be used as the thin film transistor 581 of this embodiment.

The electronic paper in FIG. 14 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is an inverted-staggered thin film transistor with a multi-gate structure, and a source electrode layer and a drain electrode layer thereof are in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions, which is filled with liquid, are provided. A space around the spherical particles 589 is filled with a filler 595 such as a resin (see FIG. 14).

In FIG. 14, an electrode layer containing a light-transmitting conductive high molecule is used as the first electrode layer. An inorganic insulating film is provided over the first electrode layer 587. The inorganic insulating film serves as a barrier film which prevents ionic impurities from diffusing from the first electrode layer 587.

Further, instead of the twisting ball, an electrophoretic element may be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is called electronic paper in general. The electrophoretic display element has higher reflectance than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from an electric wave source.

Through the above process, highly reliable electronic paper as a semiconductor device can be manufactured.

This embodiment can be implemented by being combined with any of the structures described in other embodiments, as appropriate.

Embodiment 8

In this embodiment, an example of a light-emitting display device will be described as a semiconductor device to which an embodiment of the present invention is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. The carriers (electrons and holes) are recombined and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 15A:
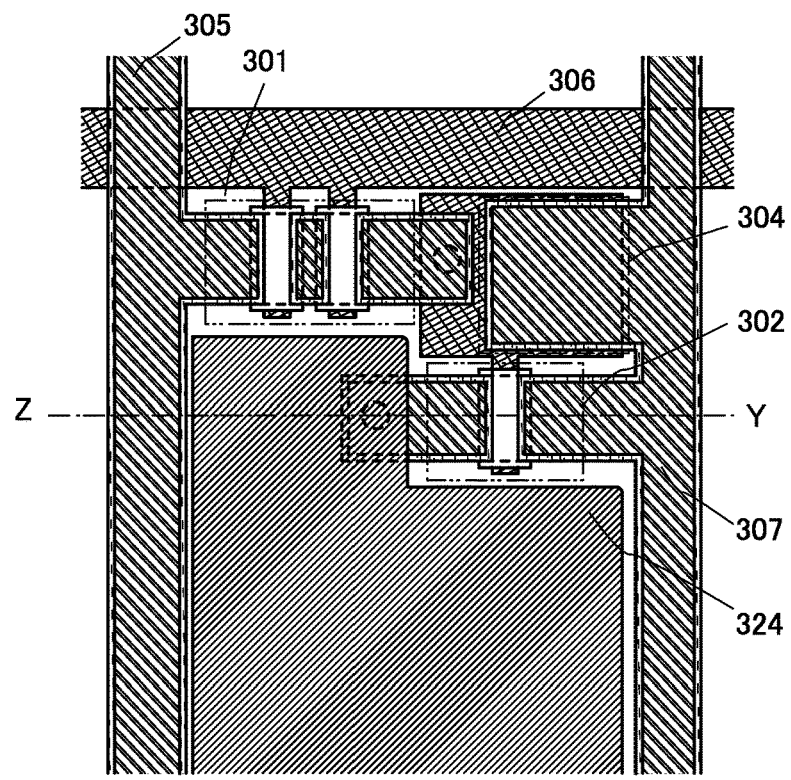
FIGS. 15A and 15B are diagrams illustrating a light-emitting display device to which an embodiment of the present invention is applied.
Figure 15B:
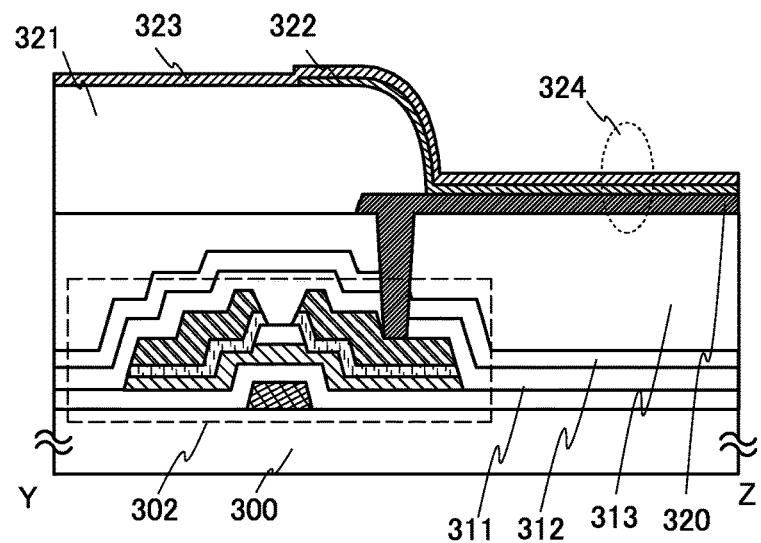

FIGS. 15A and 15B illustrate an active-matrix light-emitting display device as an example of a semiconductor device to which an embodiment of the present invention is applied. FIG. 15A is a plane view of the light-emitting display device, and FIG. 15B is a cross-sectional view taken along a line Y-Z in FIG. 15A. Note that FIG. 16 illustrates an equivalent circuit of the light-emitting display device illustrated in FIGS. 15A and 15B.

Thin film transistors 301 and 302 used for a semiconductor device can be manufactured similarly to any of the thin film transistors described in Embodiments 1 and 3 and are highly reliable thin film transistors each including an IGZO semiconductor layer and a buffer layer formed using a layer having n-type conductivity. Alternatively, the thin film transistors described in Embodiment 2 may be used as the thin film transistors 301 and 302 of this embodiment.

Figure 16:
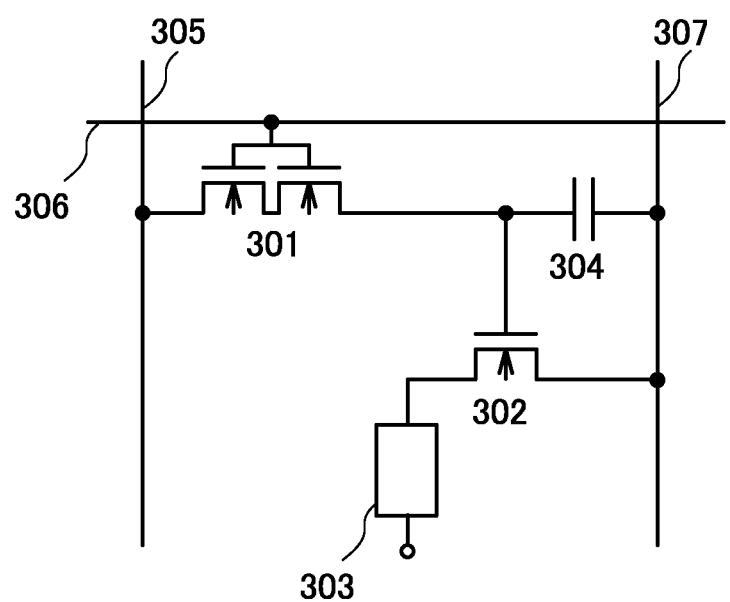
FIG. 16 is a diagram illustrating a light-emitting display device to which an embodiment of the present invention is applied.

The light-emitting display device of this embodiment illustrated in FIG. 15A and FIG. 16 includes the thin film transistors 301 and 302 with a multi-gate structure, a light-emitting element 303, a capacitor element 304, a source wiring layer 305, a gate wiring layer 306, and a power supply line 307. The thin film transistors 301 and 302 are n-channel thin film transistors.

In FIG. 15B, the light-emitting display device of this embodiment includes the thin film transistor 302; an insulating layer 311; an insulating layer 312; an insulating layer 313; a partition wall 321; and a first electrode layer 320, an electroluminescent layer 322, and a second electrode layer 323 which are used for the light-emitting element 324.

The insulating layer 313 is preferably formed using an organic resin such as acrylic, polyimide, or polyamide or using siloxane.

Since the thin film transistor 302 in the pixel is n-type in this embodiment, a cathode is desirably used as the first electrode layer 320 which is a pixel electrode layer. Specifically, for the cathode, a material with a low work function such as Ca, Al, CaF, MgAg, or AlLi can be used.

The partition wall 321 is formed using an organic resin film, an inorganic insulating film, or organic polysiloxane. It is particularly preferable that the partition wall 321 be formed using a photosensitive material and an opening be formed over the first electrode layer 320 so that a sidewall of the opening is formed as an inclined surface with continuous curvature.

The electroluminescent layer 322 may be formed using a single layer or a plurality of layers stacked.

The second electrode layer 323 is formed as an anode to cover the electroluminescent layer 322. The second electrode layer 323 can be formed using a light-transmitting conductive film using any of the light-transmitting conductive materials listed in Embodiment 7 for the pixel electrode layer. The second electrode layer 323 may be formed using a titanium nitride film or a titanium film instead of the above-described light-transmitting conductive film. The light-emitting element 324 is formed by overlapping of the first electrode layer 320, the electroluminescent layer 322, and the second electrode layer 323. After that, a protective film may be formed over the second electrode layer 323 and the partition wall 321 in order to prevent entry of oxygen, hydrogen, moisture, carbon dioxide, or the like into the light-emitting element 324. As the protective film, a silicon nitride film, a silicon nitride oxide film, a DLC film, or the like can be formed.

Further, in a practical case, it is preferable that a display device completed up to the state illustrated in FIG. 15B be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 17A to 17C. A cross-sectional structure of a pixel will be described by taking an n-type driving TFT as an example. Driving TFTs 7001, 7011, and 7021 used for the semiconductor devices illustrated in FIGS. 17A to 17C can be manufactured similarly to the thin film transistor described in Embodiment 1 and are highly reliable thin film transistors each having an IGZO semiconductor layer and a buffer layer having n-type conductivity. Alternatively, the thin film transistors described in Embodiment 2 or 3 can be used as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure to which an embodiment of the present invention is applied can be applied to a light-emitting element having any of these emission structures.

A light-emitting element having a top emission structure will be described with reference to FIG. 17A.

Figure 17A:
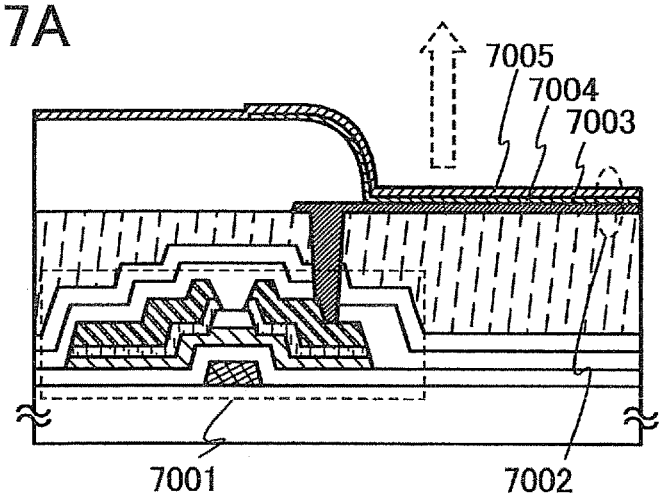
FIGS. 17A to 17C are diagrams each illustrating a light-emitting display device to which an embodiment of the present invention is applied.

FIG. 17A is a cross-sectional view of a pixel in the case where the driving TFT 7001 is of an n-type TFT and light is emitted from a light-emitting element 7002 to an anode 7005 side. In FIG. 17A, a cathode 7003 of the light-emitting element 7002 is electrically connected to the driving TFT 7001, and a light-emitting layer 7004 and the anode 7005 are stacked in this order over the cathode 7003. The cathode 7003 can be formed using any of a variety of conductive materials as long as it has a low work function and reflect light. For example, Ca, Al, CaF, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that it is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 17A, light is emitted from the light-emitting element 7002 to the anode 7005 side as indicated by an arrow.

Next, a light-emitting element having a bottom emission structure will be described with reference to FIG. 17B. FIG. 17B is a cross-sectional view of a pixel in the case where the driving TFT 7011 is of an n-type and light is emitted from a light-emitting element 7012 to a cathode 7013 side. In FIG. 17B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used as in the case of FIG. 17A as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. In a similar manner to the case of FIG. 17A, the light-emitting layer 7014 may be formed using either a single layer or a plurality of layers stacked. The anode 7015 is not required to transmit light, but can be formed using a light-transmitting conductive material as in the case of FIG. 17A. As the light-blocking film 7016, a metal or the like that reflects light can be used for example; however, it is not limited to a metal film. For example, a resin or the like to which black pigments are added may alternatively be used.

The light-emitting element 7012 corresponds to a region where the cathode 7013 and the anode 7015 sandwich the light-emitting layer 7014. In the case of the pixel illustrated in FIG. 17B, light is emitted from the light-emitting element 7012 to the cathode 7013 side as indicated by an arrow.

Next, a light-emitting element having a dual emission structure will be described with reference to FIG. 17C. In FIG. 17C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 17A, the cathode 7023 can be formed using any of a variety of conductive materials as long as it has a low work function. Note that the cathode 7023 is formed to have a thickness that can transmit light. For example, a film of Al having a thickness of 20 nm can be used as the cathode 7023. As in FIG. 17A, the light-emitting layer 7024 may be formed using either a single layer or a plurality of layers stacked. The anode 7025 can be formed using a light-transmitting conductive material as in the case of FIG. 17A.

The light-emitting element 7022 corresponds to a region where the cathode 7023, the light-emitting layer 7024, and the anode 7025 overlap with one another. In the case of the pixel illustrated in FIG. 17C, light is emitted from the light-emitting element 7022 to both the anode 7025 side and the cathode 7023 side as indicated by arrows.

Note that, although an organic EL element is described here as a light-emitting element, an inorganic EL element can alternatively be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 17B:
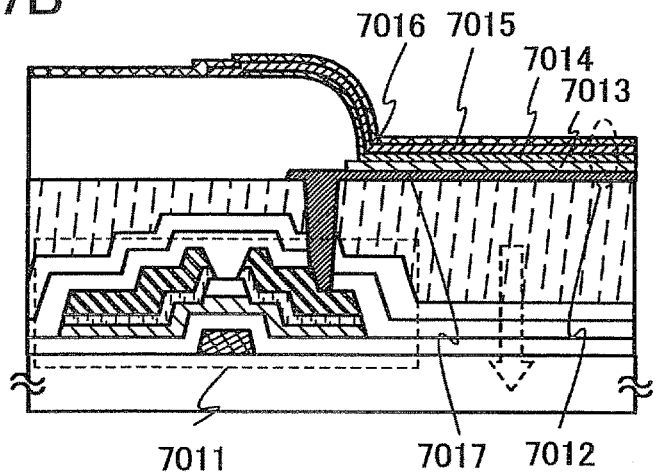
Figure 17C:
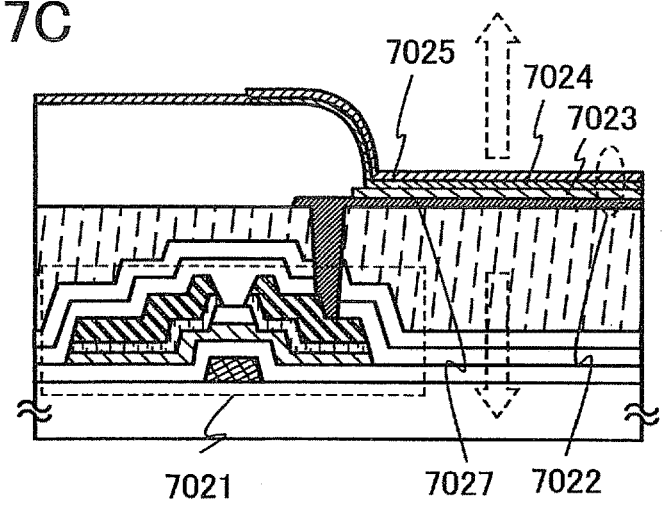

A semiconductor device described in this embodiment is not limited to the structures illustrated in FIGS. 17A to 17C and can be modified in various ways based on the spirit of techniques according to the present invention.

Through the above process, a highly reliable light-emitting display device as a semiconductor device can be manufactured.

This embodiment can be implemented by being combined with any of the structures described in other embodiments, as appropriate.

Embodiment 9

Next, a structure of a display panel mounted with a semiconductor device to which an embodiment of the present invention is applied will be described below. In this embodiment, a liquid crystal display panel (also referred to as a liquid crystal panel), which is an embodiment of a liquid crystal display device having a liquid crystal element as a display element, and a light-emitting display panel (also referred to as a light-emitting panel), which is an embodiment of a semiconductor device having a light-emitting element as a display element, will be described.

Next, the appearance and a cross section of a light-emitting display panel mounted with the semiconductor device to which an embodiment of the present invention is applied will be described with reference to FIGS. 18A and 18B. FIG. 18A is a top view of a panel in which a highly reliable thin film transistor including an IGZO semiconductor layer and a buffer layer having n-type conductivity and a light-emitting element are sealed between a first substrate and a second substrate with a sealant. FIG. 18B is a cross-sectional view taken along a line H-I in FIG. 18A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506.

The pixel portion 4502, the signal line driver circuits 4503a and 4503b, and the scan line driver circuits 4504a and 4504b which are formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 18B.

Each of the thin film transistors 4509 and 4510 corresponds to a thin film transistor including an IGZO semiconductor layer and a buffer layer having n-type conductivity, and the thin film transistors described in any one of Embodiments 1, 2, and 3 can be used as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503a and 4503b, the scan line driver circuits 4504a and 4504b, or the pixel portion 4502 from FPCs 4518a and 4518b.

In this embodiment, a wiring 4516 is formed using the same material as that of the source electrode layer or the drain electrode layer. The wiring 4516 is connected to the pixel portion 4502, the signal line driver circuits 4503a and 4503b, or the scan line driver circuits 4504a and 4504b through a contact hole (not illustrated) provided in an insulating film that covers the thin film transistors 4509 and 4510. In addition, a connection terminal 4515 is formed over the wiring 4516 that is provided over an edge portion of the first substrate 4501, by using the same material as that of the first electrode layer 4517.

The connection terminal 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, instead of an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor film or polycrystalline semiconductor film over a substrate separately prepared may be mounted as the signal line driver circuits 4503a and 4503b and the scan line driver circuits 4504a and 4504b. Alternatively, only the signal line driver circuits or part thereof, or the scan line driver circuits or part thereof may be separately formed and mounted. This embodiment is not limited to the structure illustrated in FIGS. 18A and 18B.

Next, the appearance and a cross section of a liquid crystal display panel mounted with the semiconductor device to which an embodiment of the present invention is applied will be described with reference to FIGS. 19A1, 19A2, and 19B. FIGS. 19A1 and 19A2 are each a top view of a panel in which highly reliable thin film transistors 4010 and 4011 each having an IGZO semiconductor layer and a buffer layer having n-type conductivity, and a liquid crystal element 4013 are sealed between a first substrate 4001 and a second substrate 4006 with a sealant 4005. FIG. 19B is a cross-sectional view taken along a line M-N in FIGS. 19A1 and 19A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 19A1 illustrates an example of mounting the signal line driver circuit 4003 by a COG method, and FIG. 19A2 illustrates an example of mounting the signal line driver circuit 4003 by a TAB method.

The pixel portion 4002 and the scan line driver circuit 4004 which are provided over the first substrate 4001 include a plurality of thin film transistors. FIG. 19B illustrates the thin film transistor 4010 included in the pixel portion 4002 and the thin film transistor 4011 included in the scan line driver circuit 4004.

Each of the thin film transistors 4010 and 4011 corresponds to a thin film transistor including an IGZO semiconductor layer and a buffer layer having n-type conductivity, and the thin film transistors described in any one of Embodiments 1, 2, and 3 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal layer 4008 with the insulating layers 4032 and 4033 interposed between the pixel electrode layer 4030 and the counter electrode layer 4031.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may alternatively be used.

Further, a variety of signals and a potential are supplied to the signal line driver circuit 4003 which is formed separately, the scan line driver circuit 4004, or the pixel portion 4002 from an FPC 4018.

In this embodiment, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Further, FIGS. 19A1, 19A2, and 19B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 20:
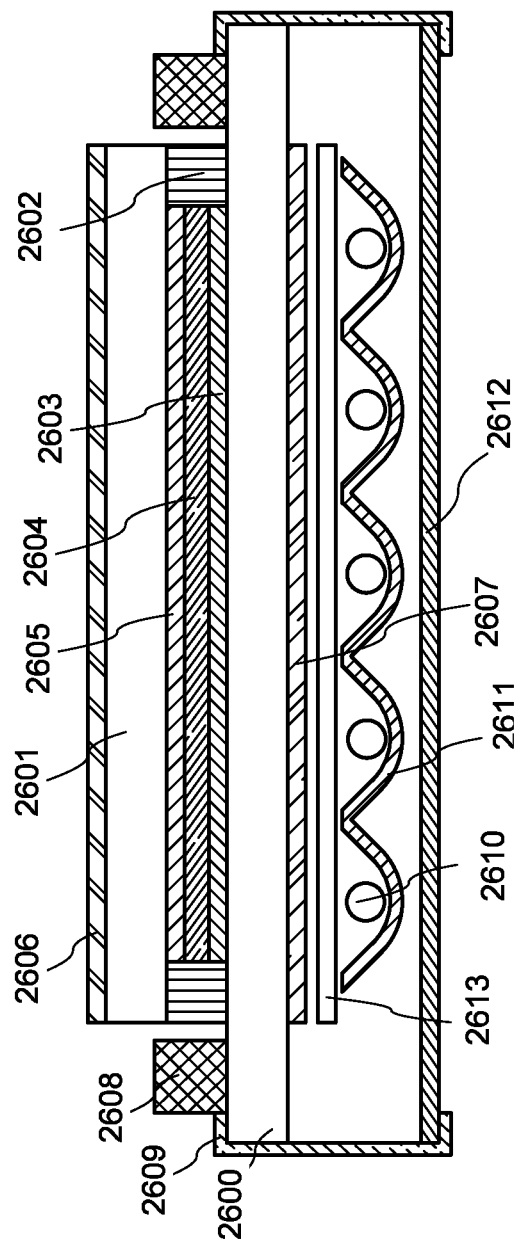
FIG. 20 is a diagram illustrating a liquid crystal display device to which an embodiment of the present invention is applied.

FIG. 20 illustrates an example in which a liquid crystal display module is formed as a semiconductor device by using a TFT substrate 2600 manufactured by application of an embodiment of the present invention.

FIG. 20 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

Through the above process, a highly reliable display panel as a semiconductor device can be manufactured.

This embodiment can be implemented by being combined with any of the structures described in other embodiments, as appropriate.

Embodiment 10

A semiconductor device according to an embodiment of the present invention can be applied to a variety of electronic appliances (including an amusement machine). Examples of electronic appliances are a television set (also referred to as a television or a television receiver), a monitor of a computer or the like, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like. In particular, a liquid crystal display device, a light-emitting device, an electrophoretic display device, or the like to which a thin film transistor according to an embodiment of the present invention is applied as described in Embodiments 6 to 9 can be used for a display portion of an electronic appliance. Specific examples will be described below.

A semiconductor device to which an embodiment of the present invention is applied can be applied to electronic paper as described in Embodiment 7. Electronic paper can be used for electronic appliances of a variety of fields as long as they can display data. For example, electronic paper can be applied to an electronic book reader (e-book reader), a poster, a transportation advertisement in a vehicle such as a train, displays of various cards such as a credit card, and the like. Examples of the electronic appliances are illustrated in FIGS. 21A and 21B, and FIG. 22.

Figure 21A:
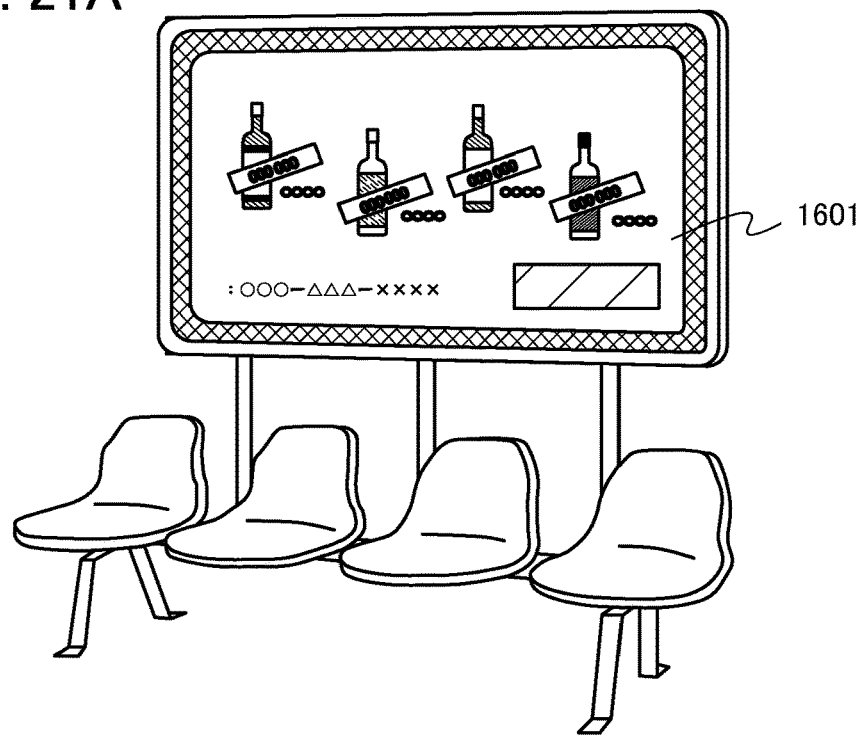
FIGS. 21A and 21B are diagrams each illustrating an electronic appliance to which an embodiment of the present invention is applied.

FIG. 21A illustrates a poster 1601 formed using electronic paper. In the case where an advertising medium is printed paper, the advertisement is replaced by manpower; however, by using electronic paper mounted with a semiconductor device to which an embodiment of the present invention is applied, the advertising display can be changed in a short time. Further, since a thin film transistor having excellent electric characteristics is used, an image can be stably displayed without being distorted. Note that the poster may transmit and receive data wirelessly.

Figure 21B:
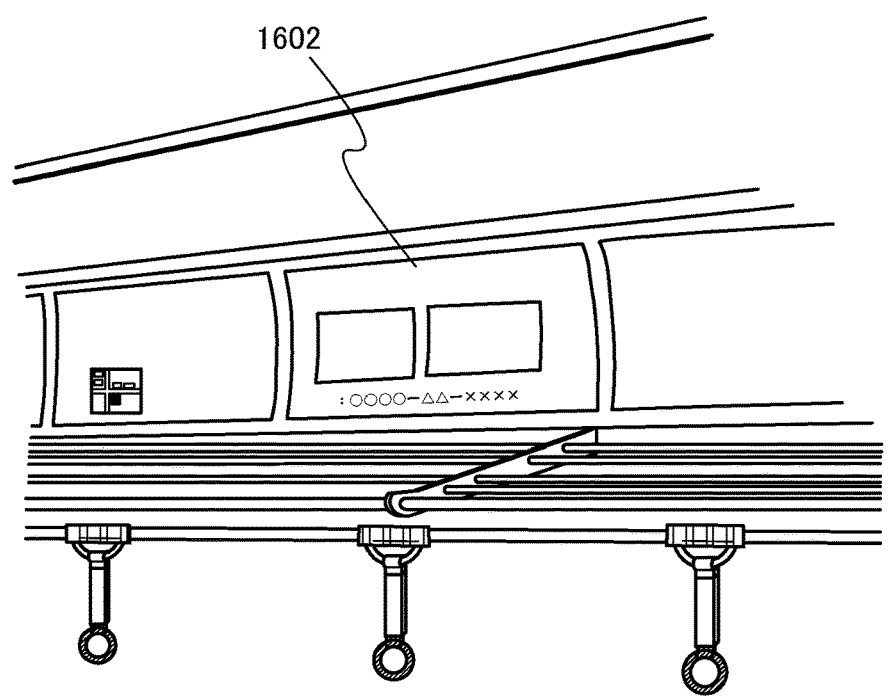

FIG. 21B illustrates an advertisement 1602 in a vehicle such as a train. In the case where an advertising medium is printed paper, the advertisement is replaced by manpower; however, by using electronic paper mounted with a semiconductor device to which an embodiment of the present invention is applied, the advertising display can be changed in a short time without a lot of manpower. Further, since a thin film transistor having excellent electric characteristics is used, an image can be stably displayed without being distorted. Note that the advertisement may transmit and receive data wirelessly.

Figure 22:
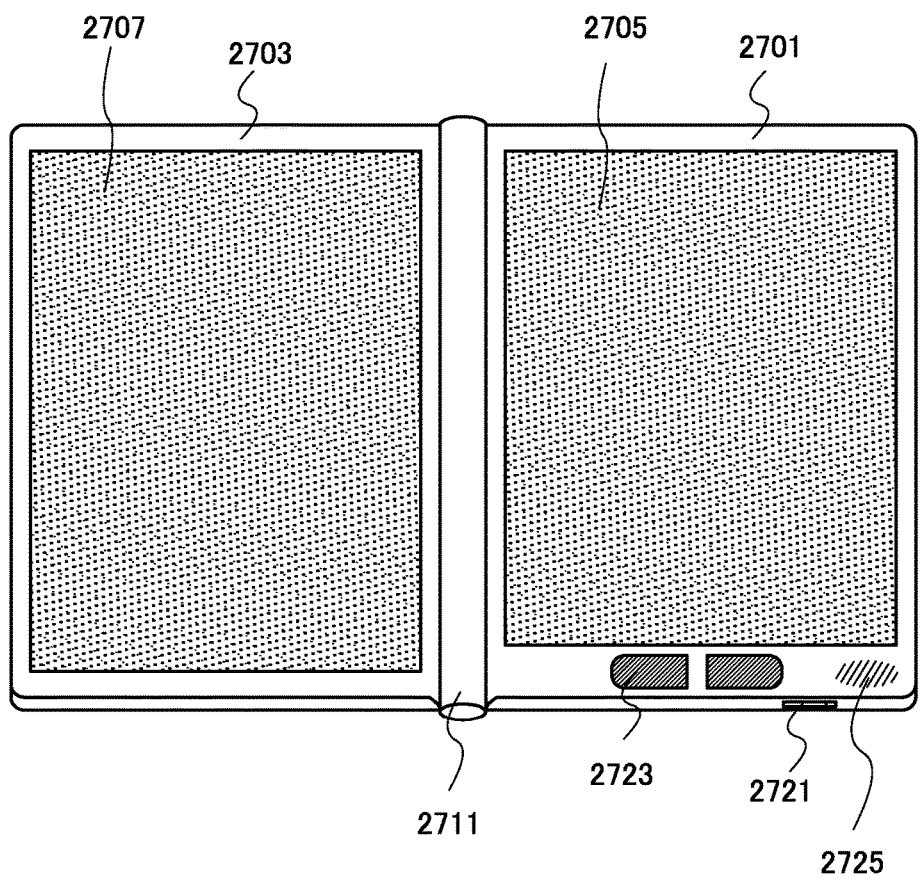
FIG. 22 is a diagram illustrating an electronic appliance to which an embodiment of the present invention is applied.

FIG. 22 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 22) can display text and a display portion on the left side (the display portion 2707 in FIG. 22) can display graphics.

FIG. 22 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book reader 2700 may have a function of an electronic dictionary.

The electronic book reader 2700 may transmit and receive data wirelessly. The structure may be employed in which a desired book data or the like is purchased and downloaded from an electronic book server wirelessly.

Figure 23A:
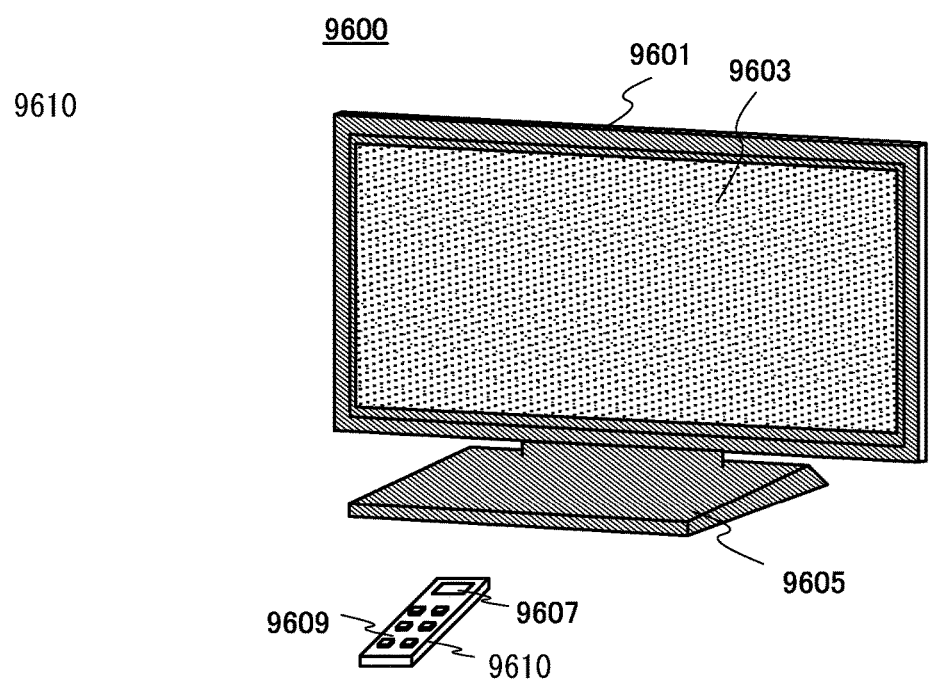
FIGS. 23A and 23B are diagrams each illustrating an electronic appliance to which an embodiment of the present invention is applied.

FIG. 23A illustrates an example of a television set 9600. In the television set 9600, a display portion 9603 is incorporated in a housing 9601. The display portion 9603 can display an image. Further, the housing 9601 is supported by a stand 9605 here. Any of the display devices described in Embodiments 6 to 9 can be applied to the display portion 9603.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 23B:
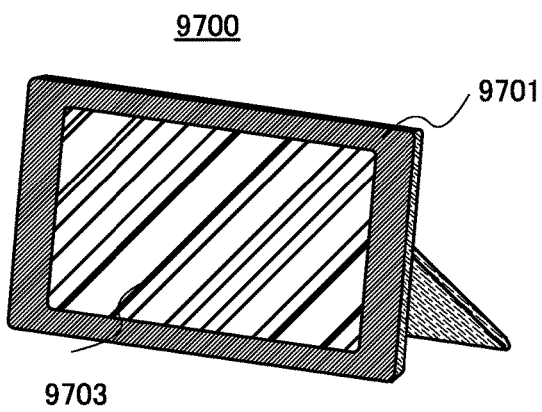

FIG. 23B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 24:
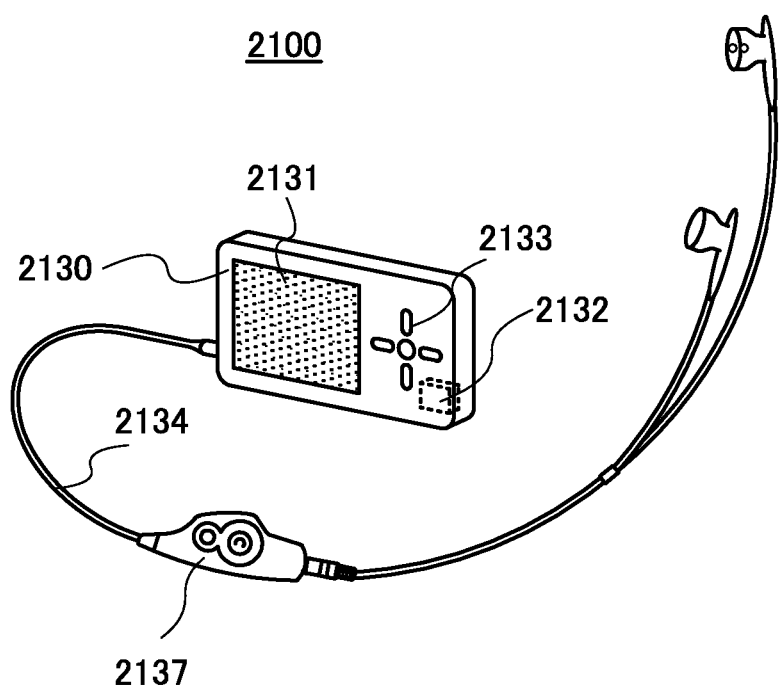
FIG. 24 is a diagram illustrating an electronic appliance to which an embodiment of the present invention is applied.

FIG. 24 illustrates an example of a digital player 2100 that is a portable audio device. The digital player 2100 includes a housing 2130, a display portion 2131, a memory portion 2132, an operation portion 2133, earphones 2134, a control portion 2137, and the like. Note that headphones or wireless earphones may be used instead of the earphones 2134. Any of the display devices described in Embodiments 6 to 9 can be applied to the display portion 2131.

Further, images and sounds (music) can be recorded and reproduced with the use of the memory portion 2132 by operating the operation portion 2133. Note that power consumption of the display portion 2131 can be suppressed through display of white text on black background. Note that a memory provided in the memory portion 2132 may be removable.

Figure 25:
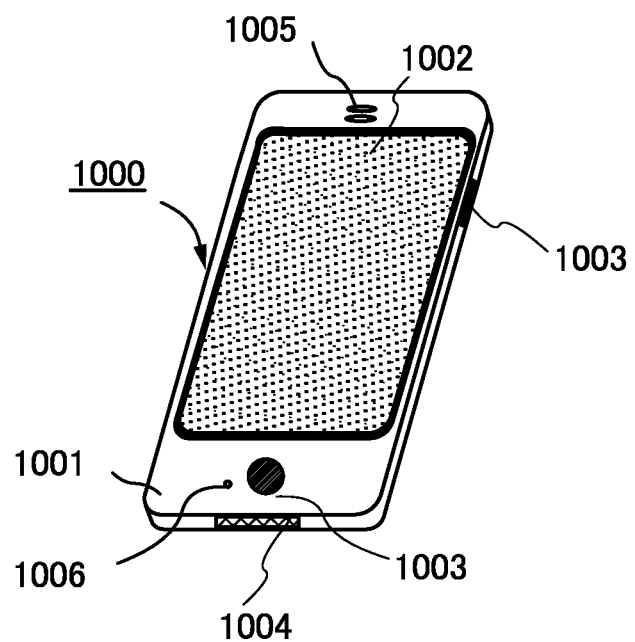
FIG. 25 is a diagram illustrating an electronic appliance to which an embodiment of the present invention is applied.

FIG. 25 illustrates an example of a mobile phone handset 1000. The mobile phone handset 1000 is provided with a display portion 1002 incorporated in a housing 1001, an operation button 1003, an external connection port 1004, a speaker 1005, a microphone 1006, and the like. The display device described in Embodiment 8 or 9 can be applied to the display portion 1002.

When the display portion 1002 of the mobile phone handset 1000 illustrated in FIG. 25 is touched with a finger or the like, data can be input into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the direction of the mobile phone handset 1000 whether the mobile phone handset 1000 is placed horizontally or vertically for a landscape mode or a portrait mode (whether the mobile phone handset 1000 stands upright or is laid down on its side).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

This embodiment can be combined with any of the structures described in the other embodiments as appropriate.

This application is based on Japanese Patent Application serial no. 2008-206006 filed with Japan Patent Office on Aug. 8, 2008, the entire contents of which are hereby incorporated by reference.

What is claimed is:

1. A semiconductor device comprising:
   a gate electrode including copper;
   a first gate insulating layer over the gate electrode, the first gate insulating layer including silicon and nitrogen;
   a second gate insulating layer over the first gate insulating layer, the second gate insulating layer including silicon and oxygen;
   an oxide semiconductor layer over and in direct contact with the second gate insulating layer, the oxide semiconductor layer comprising indium and zinc;
   an insulating layer over a channel formation region of the oxide semiconductor layer, the insulating layer including silicon and oxygen;
   a first conductive layer over the oxide semiconductor layer, the first conductive layer including copper;
   a second conductive layer over the oxide semiconductor layer, the second conductive layer including copper;
   a third conductive layer between the oxide semiconductor layer and the first conductive layer; and
   a fourth conductive layer between the oxide semiconductor layer and the second conductive layer,
   wherein the oxide semiconductor layer includes a first region and a second region,
   wherein the first region includes a first top surface of the oxide semiconductor layer and a first bottom surface of the oxide semiconductor layer, and is in direct contact with the insulating layer,
   wherein the second region includes a second top surface of the oxide semiconductor layer and a second bottom surface of the oxide semiconductor layer,
   wherein the first conductive layer overlaps the second region,
   wherein a thickness of the second region is smaller than a thickness of the first region,
   wherein a length of the third conductive layer in a channel length direction of the oxide semiconductor layer is larger than a length of the first conductive layer in the channel length direction of the oxide semiconductor layer, and
   wherein a length of the fourth conductive layer in the channel length direction of the oxide semiconductor layer is larger than a length of the second conductive layer in the channel length direction of the oxide semiconductor layer.

2. The semiconductor device according to claim 1,
   wherein the third conductive layer includes titanium, and
   wherein the fourth conductive layer includes titanium.

3. The semiconductor device according to claim 1, wherein the oxide semiconductor layer comprises gallium.

4. The semiconductor device according to claim 1, wherein the oxide semiconductor layer is formed by using a target obtained by mixing indium oxide, gallium oxide, and zinc oxide and performing sintering of the mixture of indium oxide, gallium oxide, and zinc oxide.

5. The semiconductor device according to claim 1, wherein each of the third conductive layer and the fourth conductive layer has n-type conductivity.

6. The semiconductor device according to claim 1,
   wherein the insulating layer overlaps the gate electrode,
   wherein the insulating layer does not overlap a region of the oxide semiconductor layer, and
   wherein the region of the oxide semiconductor layer does not overlap the gate electrode.

7. The semiconductor device according to claim 1, wherein the second gate insulating layer contains excessive oxygen.

8. The semiconductor device according to claim 1, wherein the oxide semiconductor layer contains excessive oxygen.

9. The semiconductor device according to claim 1, wherein each of the third conductive layer and the fourth conductive layer includes oxygen.

10. The semiconductor device according to claim 1, wherein each of the third conductive layer and the fourth conductive layer includes metal oxide.

11. The semiconductor device according to claim 1, wherein each of the third conductive layer and the fourth conductive layer is a buffer layer.

12. A semiconductor device comprising:
    a gate electrode including copper;
    a first gate insulating layer over the gate electrode, the first gate insulating layer including silicon and nitrogen;
    a second gate insulating layer over the first gate insulating layer, the second gate insulating layer including silicon and oxygen;
    an oxide semiconductor layer over and in direct contact with the second gate insulating layer, the oxide semiconductor layer comprising indium and zinc;
    an insulating layer over a channel formation region of the oxide semiconductor layer, the insulating layer including silicon and oxygen;
    a first conductive layer over the oxide semiconductor layer, the first conductive layer including copper;

a second conductive layer over the oxide semiconductor layer, the second conductive layer including copper;
a third conductive layer between the oxide semiconductor layer and the first conductive layer; and
a fourth conductive layer between the oxide semiconductor layer and the second conductive layer,
wherein the oxide semiconductor layer includes a first region and a second region,
wherein the first region includes a first top surface of the oxide semiconductor layer and a first bottom surface of the oxide semiconductor layer, and is in direct contact with the insulating layer,
wherein the second region includes a second top surface of the oxide semiconductor layer and a second bottom surface of the oxide semiconductor layer,
wherein the first conductive layer overlaps the second region,
wherein a thickness of the second region is smaller than a thickness of the first region,
wherein the gate electrode has a light-shielding property,
wherein a length of the third conductive layer in a channel length direction of the oxide semiconductor layer is larger than a length of the first conductive layer in the channel length direction of the oxide semiconductor layer, and
wherein a length of the fourth conductive layer in the channel length direction of the oxide semiconductor layer is larger than a length of the second conductive layer in the channel length direction of the oxide semiconductor layer.

13. The semiconductor device according to claim 12, wherein the third conductive layer includes titanium, and wherein the fourth conductive layer includes titanium.

14. The semiconductor device according to claim 12, wherein the oxide semiconductor layer comprises gallium.

15. The semiconductor device according to claim 12, wherein the oxide semiconductor layer is formed by using a target obtained by mixing indium oxide, gallium oxide, and zinc oxide and performing sintering of the mixture of indium oxide, gallium oxide, and zinc oxide.

16. The semiconductor device according to claim 12, wherein each of the third conductive layer and the fourth conductive layer has n-type conductivity.

17. The semiconductor device according to claim 12,
wherein the insulating layer overlaps the gate electrode,
wherein the insulating layer does not overlap a region of the oxide semiconductor layer, and
wherein the region of the oxide semiconductor layer does not overlap the gate electrode.

18. The semiconductor device according to claim 12, wherein the second gate insulating layer contains excessive oxygen.

19. The semiconductor device according to claim 12, wherein the oxide semiconductor layer contains excessive oxygen.

20. The semiconductor device according to claim 12, wherein each of the third conductive layer and the fourth conductive layer includes oxygen.

21. The semiconductor device according to claim 12, wherein each of the third conductive layer and the fourth conductive layer includes metal oxide.

22. The semiconductor device according to claim 12, wherein each of the third conductive layer and the fourth conductive layer is a buffer layer.

23. A semiconductor device comprising:
a gate electrode including copper;
a first gate insulating layer over the gate electrode, the first gate insulating layer including silicon and nitrogen;
a second gate insulating layer over the first gate insulating layer, the second gate insulating layer including silicon and oxygen;
an oxide semiconductor layer over and in direct contact with the second gate insulating layer, the oxide semiconductor layer comprising indium and zinc;
an insulating layer over a channel formation region of the oxide semiconductor layer, the insulating layer including silicon and oxygen;
a first conductive layer over the oxide semiconductor layer, the first conductive layer including copper;
a second conductive layer over the oxide semiconductor layer, the second conductive layer including copper;
a third conductive layer between the oxide semiconductor layer and the first conductive layer; and
a fourth conductive layer between the oxide semiconductor layer and the second conductive layer,
wherein the oxide semiconductor layer includes a first region and a second region,
wherein the first region includes a first top surface of the oxide semiconductor layer and a first bottom surface of the oxide semiconductor layer, and is in direct contact with the insulating layer,
wherein the second region includes a second top surface of the oxide semiconductor layer and a second bottom surface of the oxide semiconductor layer,
wherein the first conductive layer overlaps the second region,
wherein a thickness of the second region is smaller than a thickness of the first region,
wherein the gate electrode has a light-shielding property,
wherein each of the first gate insulating layer and the second gate insulating layer has a light-transmitting property,
wherein a length of the third conductive layer in a channel length direction of the oxide semiconductor layer is larger than a length of the first conductive layer in the channel length direction of the oxide semiconductor layer, and
wherein a length of the fourth conductive layer in the channel length direction of the oxide semiconductor layer is larger than a length of the second conductive layer in the channel length direction of the oxide semiconductor layer.

24. The semiconductor device according to claim 23, wherein the third conductive layer includes titanium, and wherein the fourth conductive layer includes titanium.

25. The semiconductor device according to claim 23, wherein the oxide semiconductor layer comprises gallium.

26. The semiconductor device according to claim 23, wherein the oxide semiconductor layer is formed by using a target obtained by mixing indium oxide, gallium oxide, and zinc oxide and performing sintering of the mixture of indium oxide, gallium oxide, and zinc oxide.

27. The semiconductor device according to claim 23, wherein each of the third conductive layer and the fourth conductive layer has n-type conductivity.

28. The semiconductor device according to claim 23,
wherein the insulating layer overlaps the gate electrode,
wherein the insulating layer does not overlap a region of the oxide semiconductor layer, and
wherein the region of the oxide semiconductor layer does not overlap the gate electrode.

29. The semiconductor device according to claim 23, wherein the second gate insulating layer contains excessive oxygen.

30. The semiconductor device according to claim 23, wherein the oxide semiconductor layer contains excessive oxygen.

31. The semiconductor device according to claim 23, wherein each of the third conductive layer and the fourth conductive layer includes oxygen.

32. The semiconductor device according to claim 23, wherein each of the third conductive layer and the fourth conductive layer includes metal oxide.

33. The semiconductor device according to claim 23, wherein each of the third conductive layer and the fourth conductive layer is a buffer layer.

34. A semiconductor device comprising:
a substrate including glass;
a gate electrode over the substrate, the gate electrode including copper;
a first gate insulating layer over the gate electrode, the first gate insulating layer including silicon and nitrogen;
a second gate insulating layer over the first gate insulating layer, the second gate insulating layer including silicon and oxygen;
an oxide semiconductor layer over and in direct contact with the second gate insulating layer, the oxide semiconductor layer comprising indium, gallium and zinc;
an insulating layer over a channel formation region of the oxide semiconductor layer, the insulating layer including silicon and oxygen;
a first conductive layer over the oxide semiconductor layer, the first conductive layer including copper;
a second conductive layer over the oxide semiconductor layer, the second conductive layer including copper;
a third conductive layer between the oxide semiconductor layer and the first conductive layer; and
a fourth conductive layer between the oxide semiconductor layer and the second conductive layer,
wherein the oxide semiconductor layer includes a first region and a second region,
wherein the first region includes a first top surface of the oxide semiconductor layer and a first bottom surface of the oxide semiconductor layer, and is in direct contact with the insulating layer,
wherein the second region includes a second top surface of the oxide semiconductor layer and a second bottom surface of the oxide semiconductor layer,
wherein the first conductive layer overlaps the second region,
wherein a thickness of the second region is smaller than a thickness of the first region,
wherein a length of the third conductive layer in a channel length direction of the oxide semiconductor layer is larger than a length of the first conductive layer in the channel length direction of the oxide semiconductor layer,
wherein a length of the fourth conductive layer in the channel length direction of the oxide semiconductor layer is larger than a length of the second conductive layer in the channel length direction of the oxide semiconductor layer,
wherein the third conductive layer includes titanium, and
wherein the fourth conductive layer includes titanium.

35. The semiconductor device according to claim 34, wherein the oxide semiconductor layer is formed by using a target obtained by mixing indium oxide, gallium oxide, and zinc oxide and performing sintering of the mixture of indium oxide, gallium oxide, and zinc oxide.

36. The semiconductor device according to claim 34, wherein each of the third conductive layer and the fourth conductive layer has n-type conductivity.

37. The semiconductor device according to claim 34,
wherein the insulating layer overlaps the gate electrode,
wherein the insulating layer does not overlap a region of the oxide semiconductor layer, and
wherein the region of the oxide semiconductor layer does not overlap the gate electrode.

38. The semiconductor device according to claim 34, wherein the second gate insulating layer contains excessive oxygen.

39. The semiconductor device according to claim 34, wherein the oxide semiconductor layer contains excessive oxygen.

40. The semiconductor device according to claim 34, wherein each of the third conductive layer and the fourth conductive layer includes oxygen.

41. The semiconductor device according to claim 34, wherein each of the third conductive layer and the fourth conductive layer includes metal oxide.

42. The semiconductor device according to claim 34, wherein each of the third conductive layer and the fourth conductive layer is a buffer layer.

* * * * *